(12) United States Patent
Eki

(10) Patent No.: US 11,792,551 B2
(45) Date of Patent: Oct. 17, 2023

(54) STACKED LIGHT RECEIVING SENSOR AND ELECTRONIC APPARATUS

(71) Applicant: Sony Semiconductor Solutions Corporation, Kanagawa (JP)

(72) Inventor: Ryoji Eki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/283,073

(22) PCT Filed: Oct. 18, 2019

(86) PCT No.: PCT/JP2019/041033
§ 371 (c)(1),
(2) Date: Apr. 6, 2021

(87) PCT Pub. No.: WO2020/090509
PCT Pub. Date: May 7, 2020

(65) Prior Publication Data
US 2021/0385403 A1  Dec. 9, 2021

(30) Foreign Application Priority Data

Oct. 31, 2018 (JP) ................ 2018-206014

(51) Int. Cl.
*H04N 25/79* (2023.01)
*H01L 27/146* (2006.01)
(Continued)

(52) U.S. Cl.
CPC ....... *H04N 25/79* (2023.01); *H01L 27/14647* (2013.01); *H04N 25/74* (2023.01);
(Continued)

(58) Field of Classification Search
CPC .......... H04N 5/37455; H04N 5/37452; H04N 5/376; H04N 5/379; H04N 5/369;
(Continued)

(56) References Cited

U.S. PATENT DOCUMENTS

2006/0023109 A1* 2/2006 Mabuchi ................ H04N 5/374
348/340
2012/0262610 A1* 10/2012 Rissa ................... H04N 5/2351
348/E9.003
(Continued)

FOREIGN PATENT DOCUMENTS

JP 2017-139497 A 8/2017
WO 2015/159728 A1 10/2015
(Continued)

OTHER PUBLICATIONS

International Search Report (PCT/ISA/210), International Application No. PCT/JP2019/041033, dated Dec. 17, 2019.
(Continued)

*Primary Examiner* — Abdelaaziz Tissire
(74) *Attorney, Agent, or Firm* — Michael Best & Friedrich LLP

(57) ABSTRACT

A stacked light receiving sensor according to one embodiment includes a first substrate in a first layer, a second substrate joined with the first substrate and formed in a second layer, and a third substrate joined with the second substrate and formed in a third layer. An analog circuit reads a pixel signal from a pixel array. A logic circuit is connected to the analog circuit and outputs the pixel signal. A processing section executes processing based on a neural network computing model, on data based on the pixel signal. The pixel array is disposed on the first layer. The analog circuit is disposed on any one or more of the first to third layers. The
(Continued)

logic circuit, the processing section, and a memory are disposed on any one or more of the second and third layers.

20 Claims, 26 Drawing Sheets

(51) Int. Cl.
*H04N 25/772* (2023.01)
*H04N 25/74* (2023.01)
*H04N 25/771* (2023.01)

(52) U.S. Cl.
CPC ......... *H04N 25/771* (2023.01); *H04N 25/772* (2023.01); *H01L 27/1464* (2013.01)

(58) Field of Classification Search
CPC .... H04N 25/772; H04N 25/74; H04N 25/771; H04N 25/79; H04N 25/70; H01L 27/14647; H01L 27/1464; H01L 27/14636; H01L 27/14634; H01L 27/14601; G06N 3/063; G06N 3/049; G06V 40/171; G06V 10/454; G06V 10/94
See application file for complete search history.

(56) References Cited

U.S. PATENT DOCUMENTS

| | | | | |
|---|---|---|---|---|
| 2012/0293698 | A1* | 11/2012 | Sukegawa | H04N 5/3745 257/774 |
| 2013/0314573 | A1* | 11/2013 | Tsukimura | H04N 5/335 348/302 |
| 2014/0014813 | A1* | 1/2014 | Mao | H01L 27/14634 257/659 |
| 2014/0015600 | A1* | 1/2014 | Sato | H01L 27/1464 257/443 |
| 2014/0077063 | A1* | 3/2014 | Cho | H04N 5/379 257/443 |
| 2017/0155865 | A1* | 6/2017 | Nakajima | H04N 5/374 |
| 2017/0243819 | A1* | 8/2017 | Kagawa | H01L 23/5225 |
| 2018/0240797 | A1* | 8/2018 | Yokoyama | H01L 25/074 |
| 2019/0158732 | A1* | 5/2019 | Shimauchi | H04N 5/23219 |
| 2019/0204448 | A1* | 7/2019 | Eki | G01S 17/93 |
| 2021/0112213 | A1* | 4/2021 | Oka | H04N 5/369 |
| 2021/0168318 | A1* | 6/2021 | Eki | G06K 9/627 |
| 2021/0266488 | A1* | 8/2021 | Eki | G06V 20/58 |

FOREIGN PATENT DOCUMENTS

| | | | | |
|---|---|---|---|---|
| WO | 2016/056409 | A1 | 4/2016 | |
| WO | WO-2017209221 | A * | 12/2017 | ....... H01L 27/14618 |
| WO | 2018/003502 | A1 | 1/2018 | |
| WO | 2018/051809 | A1 | 3/2018 | |
| WO | WO-2018051809 | A1 * | 3/2018 | ............... G01C 3/06 |

OTHER PUBLICATIONS

Notification of Transmittal of the International Search Report and the Written Opinion of the International Searching Authority, or the Declaration (PCT/ISA/220), International Application No. PCT/JP2019/041033, dated Jan. 7, 2020.

Written Opinion of the International Search Authority (PCT/ISA/237), International Application No. PCT/JP2019/041033, dated Jan. 7, 2020.

* cited by examiner

STACKED LIGHT RECEIVING SENSOR AND ELECTRONIC APPARATUS

TECHNICAL FIELD

The present disclosure relates to a stacked light receiving sensor and an electronic apparatus.

BACKGROUND ART

There has conventionally been present, as an imaging apparatus that acquires a still image and a moving image, a flatly placed image sensor configured in such a manner that chips such as sensor chips, memory chips, and DSP (Digital Signal Processor) chips are connected to each other in parallel by a plurality of bumps.

Further, with a view to miniaturization of an imaging apparatus, a single-chip image sensor having a stacked structure in which multiple dies are stacked has been recently proposed.

CITATION LIST

Patent Literature

[PTL 1]
  PCT Patent Publication No. WO2018/051809
[PTL 2]
  JP 2017-139497A

SUMMARY

Technical Problem

Meanwhile, from viewpoints of diversification and acceleration of image processing, protection of personal information, and the like, it is desired to execute more highly advanced processing within an image sensor chip.

The present disclosure, therefore, proposes a stacked light receiving sensor and an electronic apparatus capable of executing more highly advanced processing within a chip.

Solution to Problem

To solve the problem, a stacked light receiving sensor according to one embodiment of the present disclosure includes a first substrate that forms a first layer, a second substrate that is joined with the first substrate and that forms a second layer, a third substrate that is joined with the second substrate and that forms a third layer, a pixel array section that includes a plurality of unit pixels arranged two-dimensionally in a matrix, an analog circuit that reads a pixel signal from the pixel array section, a logic circuit that is connected to the analog circuit and that outputs the pixel signal, a memory that stores therein a neural network computing model, a processing section that executes processing based on the neural network computing model, on data based on the pixel signal, and an output section that outputs a processing result at least based on the neural network computing model to an outside. The pixel array section is disposed on the first layer. The analog circuit is disposed on any one or more of the first to third layers. The logic circuit, the processing section, and the memory are disposed on any one or more of the second and third layers.

Advanced Effect

According to the stacked light receiving sensor of the embodiment of the present disclosure, it is possible to execute more highly advanced processing within a chip since the processing section that executes the processing based on the neural network computing model is provided within the chip of the stacked light receiving sensor.

DESCRIPTION OF EMBODIMENTS

Figure 1:
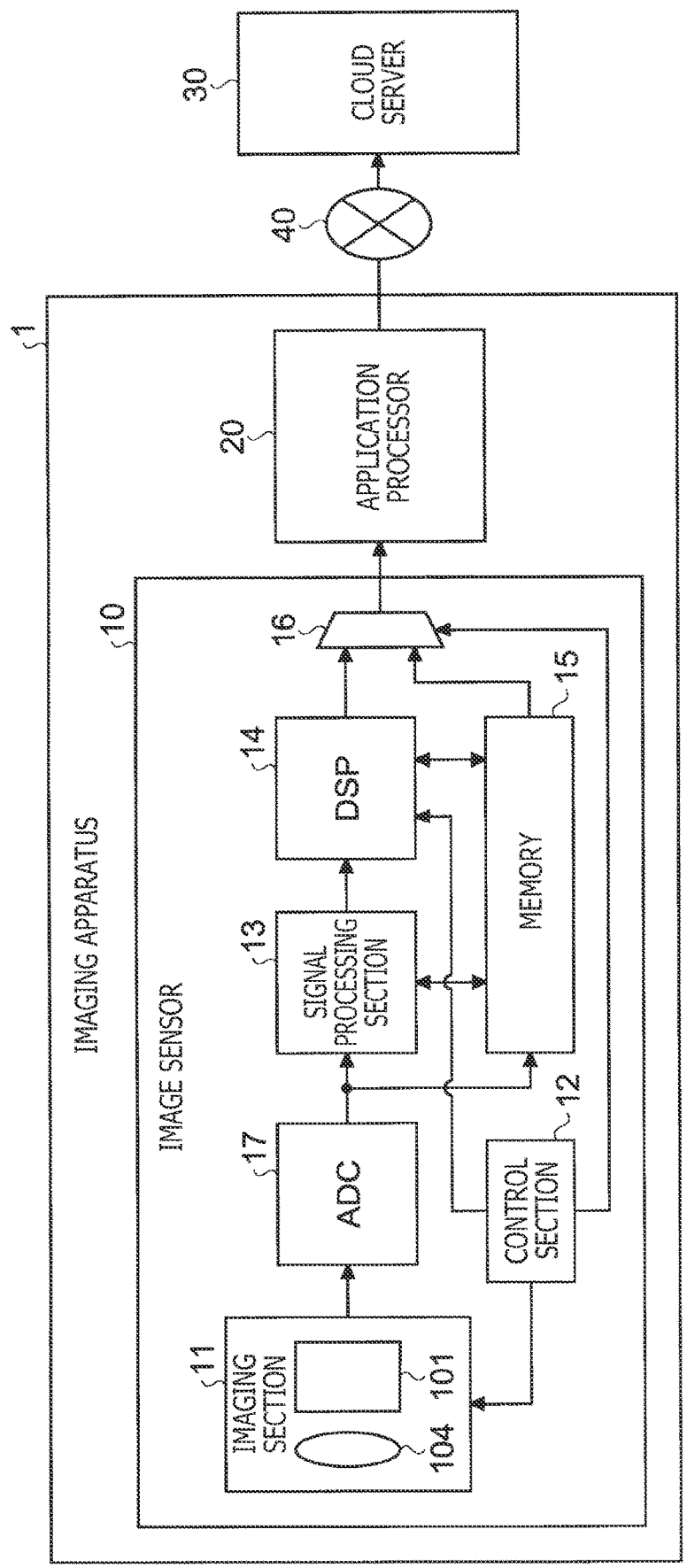
FIG. 1 is a block diagram depicting an example of a schematic configuration of an imaging apparatus serving as an electronic apparatus according to a first embodiment.

Embodiments of the present disclosure will be described hereinafter in detail on the basis of the drawings. It is to be noted that repetitive description is omitted in the following embodiments by using the same reference sign to denote the same portion.

Further, the present disclosure will be described according to the following order of items.
1. First embodiment
   1.1 Example of schematic configuration of imaging apparatus
   1.2 Example of chip configuration of image sensor
   1.3 Floor map examples
      1.3.1 First floor map example
         1.3.1.1 Floor map example of first substrate
         1.3.1.2 Floor map example of second substrate
         1.3.1.3 Floor map example of third substrate
         1.3.1.4 Modification of first floor map
      1.3.2 Second floor map example
         1.3.2.1 Modification of second floor map
      1.3.3 Third floor map example
         1.3.3.1 Modification of third floor map
      1.3.4 Fourth floor map example
         1.3.4.1 Modification of fourth floor map
      1.3.5 Fifth floor map example
         1.3.5.1 Modification of fifth floor map
      1.3.6 Sixth floor map example
         1.3.6.1 Modification of sixth floor map
      1.3.7 Seventh floor map example
         1.3.7.1 Modification of seventh floor map
      1.3.8 Eighth floor map example
         1.3.8.1 Modification of eighth floor map
      1.3.9 Ninth floor map example
         1.3.9.1 Modification of ninth floor map
   1.4 Advantages and effects
2. Second embodiment
   2.1 Example of chip configuration of image sensor chip
   2.2 Advantages and effects
3. Third embodiment
   3.1 Example of configuration of image sensor
   3.2 Floor map examples
      3.2.1 First floor map example
         3.2.1.1 Floor map example of first substrate
         3.2.1.2 Floor map example of second substrate
         3.2.1.3 Floor map example of third substrate
         3.2.1.4 Position of electromagnetic shield
         3.2.1.5 Modification
      3.2.2 Second floor map example
         3.2.2.1 Modification
      3.2.3 Third floor map example
         3.2.3.1 First modification
         3.2.3.2 Second modification
      3.2.4 Fourth floor map example
   3.3 Advantages and effects
4. Fourth embodiment
   4.1 First example
      4.1.1 Supply of electricity to first layer
      4.1.2 Supply of electricity to second layer
         4.1.2.1 Modification of supply of electricity to second layer
      4.1.3 Supply of electricity to third layer
         4.1.3.1 Modification of supply of electricity to third layer
   4.2 Second example
      4.2.1 Supply of electricity to first and second layers
   4.3 Advantages and effects
5. Application to other sensors
6. Example of application to mobile body
7. Example of application to endoscopic surgery system
8. Example of application to WSI (Whole Slide Imaging) system

1. First Embodiment

A first embodiment will first be described in detail with reference to the drawings.

1.1 Example of Schematic Configuration of Imaging Apparatus

FIG. 1 is a block diagram depicting an example of a schematic configuration of an imaging apparatus that serves as an electronic apparatus according to the first embodiment. As depicted in FIG. 1, an imaging apparatus 1 includes an image sensor 10 that is a solid-state imaging device (also referred to as a "stacked light receiving sensor"), and an application processor 20. The image sensor 10 includes an imaging section 11, a control section 12, a converter (Analog to Digital Converter, hereinafter, referred to as an "ADC") 17, a signal processing section 13, a DSP (Digital Signal Processor) 14, a memory 15, and a selector (also referred to as an "output section") 16.

The control section 12 controls the respective sections within the image sensor 10 according to, for example, user's operations or a set operation mode.

The imaging section 11 includes, for example, an optical system 104 including a zoom lens, a focus lens, an aperture, and the like, and a pixel array section 101 configured in such a manner that unit pixels (unit pixels 101a of FIG. 4) each including a light receiving element such as a photodiode are arranged in a two-dimensional matrix. Light emitted from an outside is imaged, via the optical system 104, on a light receiving surface on which the light receiving elements in the pixel array section 101 are arranged. Each unit pixel 101a in the pixel array section 101 photoelectrically converts the light incident on the light receiving element, thereby accumulating electric charges based on a light intensity of the incident light in a readable fashion.

The ADC 17 generates digital image data by converting an analog pixel signal per unit pixel 101a read from the imaging section 11 into a digital value, and outputs the generated image data to the signal processing section 13 and/or the memory 15. It is to be noted that the ADC 17 may include a voltage generation circuit or the like that generates a drive voltage for driving the imaging section 11 from a power supply voltage or the like.

The signal processing section 13 executes various types of signal processing on the digital image data (hereinafter, referred to as "image data to be processed") either input from the ADC 17 or read from the memory 15. In a case, for example, in which the image data to be processed is a color image, the signal processing section 13 performs format conversion on this image data into YUV image data, RGB image data, or the like. Further, for example, the signal processing section 13 executes processing such as noise removal and white balance adjustment on the image data to be processed, as needed. Moreover, the signal processing section 13 executes various types of signal processing (also referred to as "preprocessing") necessary for the DSP 14 to process the image data, on the image data to be processed.

The DSP 14 functions as a processing section that executes various types of processing by using a learned model (also referred to as a "neural network computing model") created through the learning utilizing a deep neural network (DNN), by executing, for example, a program stored in the memory 15. Such a learned model (neural network computing model) may be designed on the basis of parameters generated by inputting, to a predetermined machine learning model, input signals corresponding to outputs from the pixel array section 101 and learning data linked with labels for the input signals. Further, the predetermined machine learning model may be a learning model (also referred to as a "multilayer neural network model") utilizing a multilayer neural network.

For example, the DSP 14 executes processing of multiplying a dictionary coefficient stored in the memory 15 by the image data, by executing computing processing based on the learned model stored in the memory 15. A result (computing result) obtained by such computing processing is output to the memory 15 and/or the selector 16. It is to be noted that the computing result possibly contains image data obtained by executing the computing processing using the learned model, various types of information (metadata) obtained from the image data, and the like. Further, a memory controller that controls access to the memory 15 may be incorporated into the DSP 14.

It is to be noted that the image data to be processed by the DSP 14 may be image data normally read from the pixel array section 101 or image data a data size of which is reduced by subsampling pixels of this normally read image data. Alternatively, the image data to be processed by the DSP 14 may be image data read at a smaller data size than a normal size by reading data from the pixel array section 101 while subsampling pixels. It is to be noted that normal reading may be reading without subsampling pixels.

The memory 15 stores the image data output from the ADC 17, the image data after being subjected to the signal processing by the signal processing section 13, the computing result obtained by the DSP 14, and the like, as needed. In addition, the memory 15 stores an algorithm of the learned model executed by the DSP 14 as a program and the dictionary coefficient.

It is to be noted that the DSP 14 can execute the computing processing by learning a learning model through changing weights of various parameters within the learning model by use of learning data, by preparing a plurality of learning models and then changing a learning model to be used according to the contents of computing processing, or by acquiring a learned learning model from an external apparatus.

The selector 16 selectively outputs the image data output from the DSP 14, and the image data, the computing result, and the like stored in the memory 15 according to, for example, a selection control signal from the control section 12. It is to be noted that the selector 16 may output the image data itself output from the signal processing section 13 in a case in which the DSP 14 does not execute processing on the image data output from the signal processing section 13 and in a case in which the selector 16 outputs the image data output from the DSP 14.

The image data and the computing result output from the selector 16 as described above are input to the application processor 20 that processes a display, a user interface, and the like. The application processor 20 includes, for example, a CPU (Central Processing Unit) and the like, and executes an operating system, various types of application software, and the like. The application processor 20 may mount therein such functions as a GPU (Graphics Processing Unit) and a baseband processor. Further, the application processor 20 may execute various types of processing on the received image data and the received computing result as needed, execute display of the image data and the computing result to the user, or transmit the image data and the computing result to an external cloud server 30 via a predetermined network 40.

Any of various types of networks including, for example, the Internet, a wired LAN (Local Area Network), a wireless LAN, a mobile communication network, and Bluetooth (registered trademark) can be applied to the predetermined network 40. Further, a destination of the image data and the computing result is not limited to the cloud server 30 and may be any of various information processing apparatuses (systems) including a stand-alone server, a file server that stores various types of data, and a communication terminal such as a cellular telephone that have communication functions.

1.2 Example of Chip Configuration of Image Sensor Chip

Next, an example of a chip configuration of the image sensor 10 depicted in FIG. 1 will be described hereinafter in detail with reference to the drawings.

Figure 2:
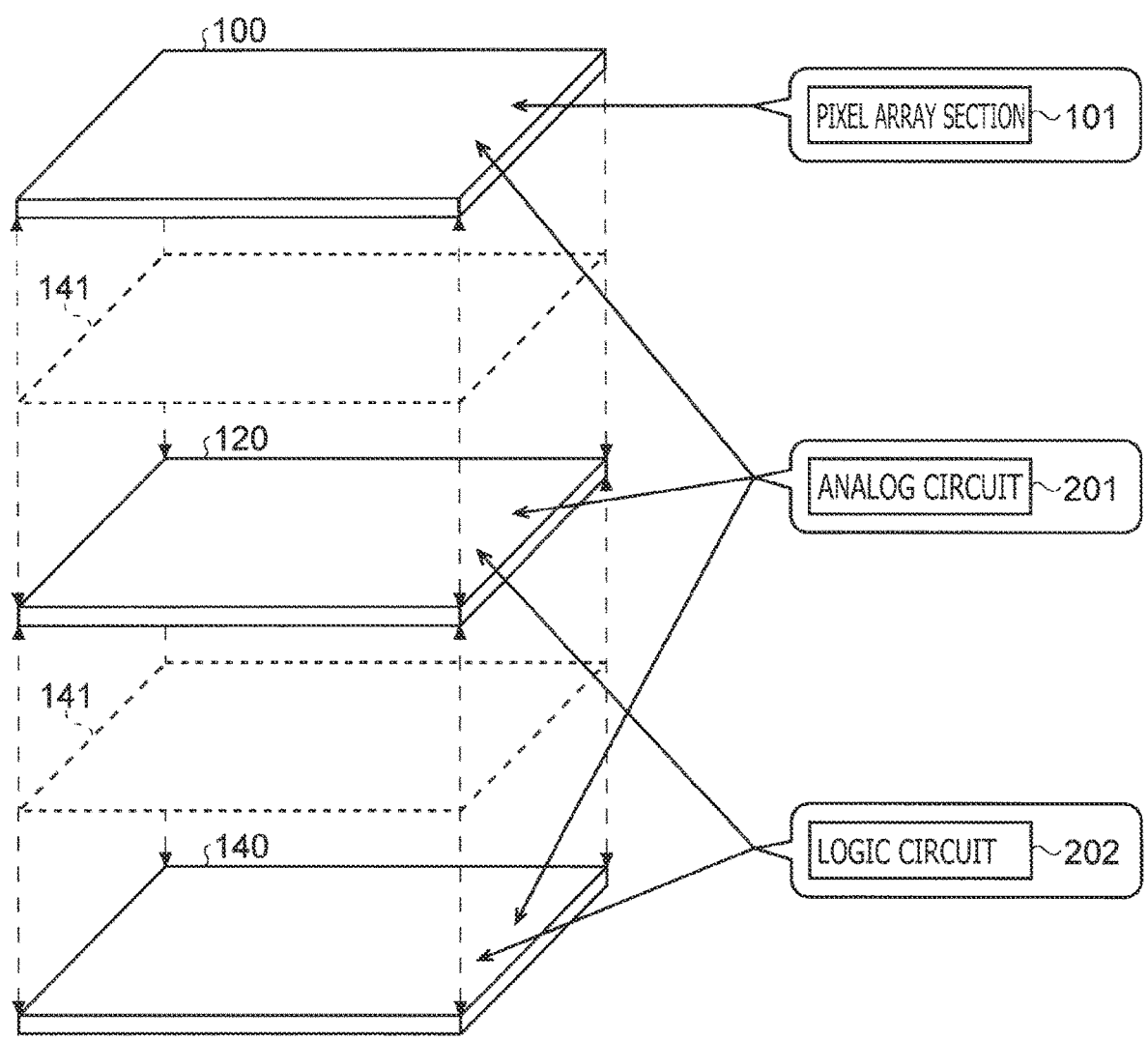
FIG. 2 is a schematic diagram depicting an example of a chip configuration of an image sensor according to the first embodiment.

FIG. 2 is a schematic diagram depicting an example of a chip configuration of the image sensor according to the present embodiment. As depicted in FIG. 2, the image sensor 10 has a three-layer stacked structure in which a first substrate (die) 100, a second substrate (die) 120, and a third substrate 140 each having a rectangular planer shape are bonded together.

For example, the first substrate 100, the second substrate 120, and the third substrate 140 may be identical in size. In addition, the first substrate 100, the second substrate 120, and the third substrate 140 may each be a semiconductor substrate such as a silicon substrate.

In the image sensor 10 depicted in FIG. 1, the pixel array section 101 of the imaging section 11 is disposed, for example, on the first substrate 100. Further, part of or entirety of the optical system 104 may be provided on the first substrate 100 in an on-chip fashion.

Part of or entirety of an analog circuit 201 in the image sensor 10 is possibly disposed in any of the first substrate 100 to the third substrate 140. The analog circuit 201 may be herein part of the ADC 17, the control section 12, or the like in the image sensor 10, and may have a circuit configuration arranged such that a power supply voltage for an analog circuit is supplied to the analog circuit 201. The analog circuit 201 possibly includes, for example, various types of transistors (hereinafter, referred to as a "pixel circuit") that read analog pixel signals from the pixel array section 101, a vertical drive circuit (also referred to as a "row driver") that drives the unit pixels 101*a* per row arranged in a two-dimensional grid fashion in row and column directions, a comparator and a counter of the ADC 17 that convert analog pixel signals read from the respective unit pixels 101*a* into digital values, a reference voltage supply section (hereinafter, referred to as a "DAC (Digital to Analog Converter)") that is provided within the control section 12 and supplies a reference voltage to this comparator, a PLL (Phase Locked Loop) circuit that synchronizes data with a master clock or the like input from the outside, and a frequency division circuit that divides a frequency of the master clock to generate a low frequency clock.

On the other hand, a logic circuit 202 in the image sensor 10 is possibly disposed on the second substrate 120 or the third substrate 140. This logic circuit 202 possibly includes not only the signal processing section 13 but also a circuit configuration which is part of the ADC 17, the control section 12, and the like and to which a power supply voltage for a logic circuit is supplied. The logic circuit 202 possibly includes, for example, the DSP 14, the memory 15, and the selector 16. Further, the logic circuit 202 possibly includes a register, a subtracter, and the like that are provided within the ADC 17 and execute correlated double sampling (CDS) on the image signal converted into the digital value.

It is to be noted, however, that distinction between the analog circuit 201 and the logic circuit 202 is not limited to that described above and may be variously changed, for example, such that the entire ADC 17 is included in the analog circuit 201 or such that the entire control section 12 is included in the logic circuit 202.

Bonding of the first substrate 100, the second substrate 120, and the third substrate 140 may be performed on the basis of what is called a CoC (Chip on Chip) scheme for fragmenting each of the first substrate 100, the second substrate 120, and the third substrate 140 into chips and then bonding these fragmented chips, on the basis of what is called a CoW (Chip on Wafer) scheme for fragmenting at least one of the first substrate 100 to the third substrate 140 into chips and then bonding the fragmented chips with a wafer that has not been fragmented, or on the basis of what is called a WoW (Wafer on Wafer) scheme for bonding the first substrate 100 to the third substrate 140 in a wafer state.

In addition, for example, plasma junction or the like can be used for each of a junction method for joining the first substrate 100 with the second substrate 120 and a junction method for joining the second substrate 120 with the third substrate 140. However, the junction method is not limited to this plasma junction method, and any of various junction methods including, for example, what is called a Cu—Cu bonding scheme for joining together copper (Cu) exposed onto joint surfaces of the respective substrates can be used.

It is to be noted herein that, in a case in which the DSP 14 is actuated as a processing section that executes computing processing based on a learned model as described above, implementation of an operation algorithm for the learned model is what is called software implementation by executing a program. Further, the operation algorithm for the learned model is updated on a daily basis. Owing to this, it is difficult to grasp in advance, for example, the timing when the DSP 14 that executes the computing processing based on the learned model executes the processing, and the timing when the processing of the DSP 14 reaches its peak.

In addition, as exemplarily depicted in FIG. 2, in the chip configuration in which the pixel array section 101 is mounted on the first substrate 100 that is an uppermost layer and in which the DSP 14 is mounted on the second substrate 120 or the third substrate 140 that is a lower substrate, in the case in which the DSP 14 is actuated as the processing section that executes computing based on the learned model, if the DSP 14 starts the computing processing or the processing of the DSP 14 reaches its peak during reset of the pixel array section 101, exposure of the pixel array section 101, or reading of the pixel signal from each unit pixel 101*a* in the pixel array section 101, there is a probability that noise (fluctuation and the like of a current or an electric field) is superimposed on the pixel signal read from the pixel array section 101, resulting in a reduction in a quality of an image acquired by the image sensor 10.

To address the possible problem, for example, an electromagnetic shield 141 that prevents the noise generated in the DSP 14 from penetrating into the pixel array section 101 may be disposed between the pixel array section 101 and the DSP 14 as depicted in FIG. 2. In a case, for example, in which the DSP 14 is disposed on the second substrate 120, the electromagnetic shield 141 may be disposed between the first substrate 100 and the second substrate 120. Further, in a case in which the DSP 14 is disposed on the third substrate 140, the electromagnetic shield 141 may be disposed between the first substrate 100 and the second substrate 120 or between the second substrate 120 and the third substrate 140. It is to be noted that the electromagnetic shield 141 is only required to be superimposed on at least part of an upper part of the DSP 14. In addition, as the electromagnetic shield 141, a thin plate, a thin film, or the like including conductive materials such as copper or nickel can be used.

In this way, interposing the electromagnetic shield 141 between the pixel array section 101 and the DSP 14 enables a reduction in the penetration of the noise derived from the signal processing performed by the DSP 14 into the pixel array section 101. It is thereby possible to suppress the reduction in the quality of the image acquired by the image sensor 10 even in the case in which the DSP 14 is actuated as the processing section that executes the computing processing based on the learned model.

1.3 Floor Map Examples

Next, floor maps of respective layers of the first substrate 100 to the third substrate 140 in the image sensor 10 according to the present embodiment will be described while referring to several examples.

1.3.1 First Floor Map Example

Figure 3:
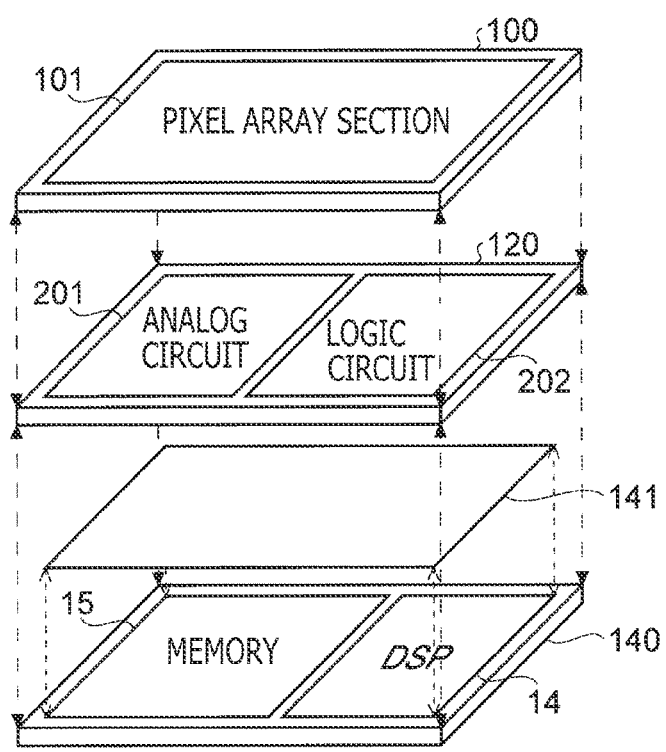
FIG. 3 is an explanatory diagram of a first floor map example according to the first embodiment.

FIG. 3 is an explanatory diagram of a first floor map example according to the present embodiment. As depicted in FIG. 3, in the first floor map example, the pixel array section 101 is disposed on the first substrate 100, the analog circuit 201 and the logic circuit 202 are disposed on the second substrate 120, and the DSP 14 and the memory 15 are disposed on the third substrate 140. Further, the electromagnetic shield 141 is disposed between the second substrate 120 and the third substrate 140 and on the DSP 14 and the memory 15. It is to be noted that the electromagnetic shield 141 is only required to be disposed at a position corresponding to at least part of the DSP 14.

Figure 4:
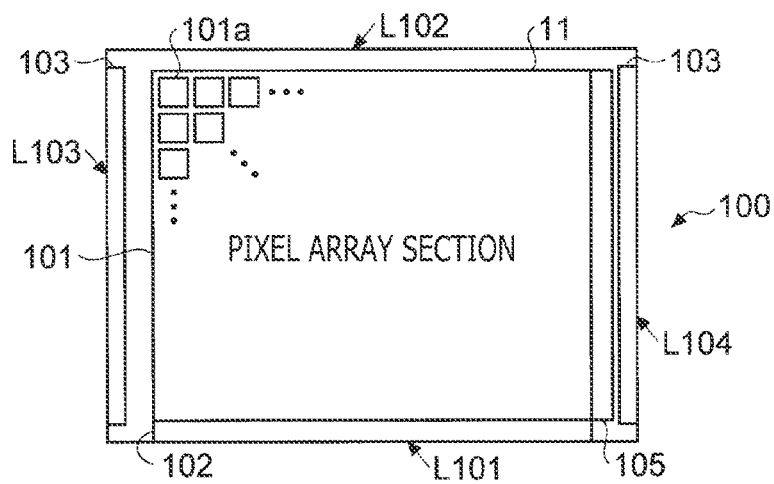
FIG. 4 is a top view depicting a floor map example of a first substrate according to the first floor map example of the first embodiment.
Figure 5:
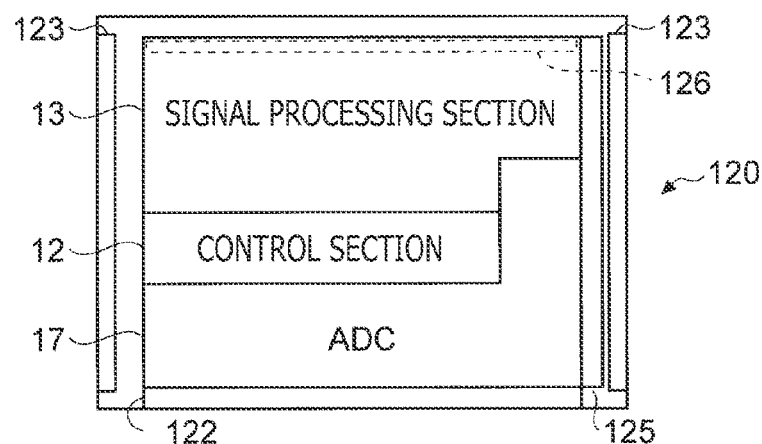
FIG. 5 is a top view depicting a floor map example of a second substrate according to the first floor map example of the first embodiment.
Figure 6:
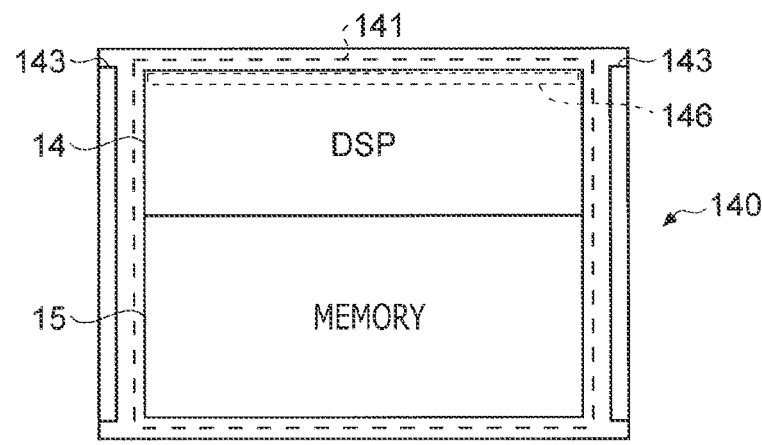
FIG. 6 is a top view depicting a floor map example of a third substrate according to the first floor map example of the first embodiment.

An example of a floor map of each layer in the first floor map example will be described herein in more detail. FIG. 4 is a top view depicting a floor map example of the first substrate, FIG. 5 is a top view depicting a floor map example of the second substrate, and FIG. 6 is a top view depicting a floor map example of the third substrate.

1.3.1.1 Floor Map Example of First Substrate

As depicted in FIG. 4, the first substrate 100 includes the pixel array section 101 disposed in most of an element formation surface of the first substrate 100. In other words, the first substrate 100 is fragmented at a size larger than a size of the pixel array section 101 to fit the size of the pixel array section 101. It is to be noted that part of or entirety of the optical system 104 is provided at a position corresponding to the pixel array section 101 in a case of mounting part of or entirety of the optical system 104 on the first substrate 100.

For example, among four sides L101 to L104 of the first substrate 100, in a region adjoining the side L101 that is parallel to a row direction of the unit pixels 101a arranged two-dimensionally in a matrix in the pixel array section 101, there is provided a TSV array 102 in which a plurality of through-interconnections (Through Silicon Vias, hereinafter, referred to as "TSVs") passing through the first substrate 100 is arranged. The TSV array 102 is provided as part of vertical signal lines that electrically connect the respective unit pixels 101a in the pixel array section 101 to the analog circuit 201 disposed on the second substrate 120. Further, in a region adjoining the side L104 that is parallel to a column direction of the unit pixels 101a arranged in the matrix, for example, there is provided a TSV array 105 in which a plurality of TSVs passing through the first substrate 100 is arranged, as part of drive lines for driving the unit pixels 101a.

Moreover, a pad array 103 including a plurality of pads arranged linearly is provided in, for example, each of the two sides L102 and L104 among the four sides L101 to L104 of the first substrate 100. Each pad array 103 includes, for example, pads (also referred to as "power supply pins") to which the power supply voltage for the analog circuit such as the pixel array section 101 and the ADC 17 is applied, and pads (also referred to as "power supply pins") to which the power supply voltage for the logic circuit such as the signal processing section 13, the DSP 14, the memory 15, the selector 16, and the control section 12 is applied. Further, each pad array 103 includes, for example, pads (also referred to as "signal pins") for interfaces such as an MIPI (Mobile Industry Processor Interface) and an SPI (Serial Peripheral Interface), and pads (also referred to as "signal pins") used for inputting and outputting a clock signal or data.

Each pad in the pad arrays 103 is electrically connected to, for example, an external power supply circuit and an external interface circuit via a wire. Preferably, each pad array 103 and the TSV array 102 are apart from each other sufficiently to such an extent that an influence of reflection of a signal from the wire connected to each pad in the pad array 103 is ignorable.

1.3.1.2 Floor Map Example of Second Substrate

As depicted in FIG. 5, an interconnection 122 that is electrically connected to the respective TSVs in the TSV array 102 passing through the first substrate 100 (hereinafter, simply referred to as the "TSV array 102") by coming in contact with the TSVs, an interconnection 125 that is electrically connected to the respective TSVs in the TSV array 105 passing through the first substrate 100 (hereinafter, simply referred to as the "TSV array 105") by coming in contact with the TSVs, and pad arrays 123 each having multiple pads that are electrically connected to the respective pads in the pad array 103 on the first substrate 100 and that are arranged linearly, are provided on the second substrate 120.

Further, the ADC 17 serving as the analog circuit 201 and the signal processing section 13 serving as the logic circuit 202 are disposed on the second substrate 120 in order from a region adjoining the interconnection 122. In other words, the analog circuit 201 and the logic circuit 202 are disposed on the second substrate 120 in such a manner that signals read to the interconnection 122 flow from upstream to downstream while it is assumed that the interconnection 122 to which the signals are read from the pixel array section 101 on the first substrate 100 is on an upstream side and that a side physically distant from the interconnection 122 is a downstream side.

Moreover, on a rear surface side of the second substrate 120, that is, the downstream side of the second substrate 120, there is provided a pad array 126 in which a plurality of electrode pads that electrically connects the signal processing section 13 to the DSP 14 on the third substrate 140 is arranged, for example.

In this way, providing a layout arranged such that the analog circuit 201 and the logic circuit 202 are disposed from upstream to downstream along a flow of signals makes it possible to shorten interconnections connecting the respective sections. It is thereby possible to reduce signal delays, reduce a signal propagation loss, improve an S/N ratio, and reduce power consumption.

Further, this layout produces advantages in that it is possible to, for example, collectively dispose the signal pins and the power supply pins for the analog circuit in the vicinity of the analog circuit 201, collectively dispose the signal pins and the power supply pins for the logic circuit in the vicinity of the logic circuit 202, and dispose the power supply pins for the analog circuit sufficiently apart from the power supply pins for the logic circuit.

It is to be noted that the control section 12 may be disposed, for example, in part of a region between the ADC 17 and the signal processing section 13.

1.3.1.3 Floor Map Example of Third Substrate

As depicted in FIG. 6, a pad array 146 in which multiple electrode pads electrically connected to respective electrode pads in the pad array 126 provided on the rear surface of the second substrate 120 are arranged, and a pad array 143 in which multiple pads electrically connected to the respective pads in the pad array 123 on the second substrate 120 are arranged linearly, are provided on the third substrate 140.

Further, the DSP 14 and the memory 15 are disposed on the third substrate 140 in order from a region adjoining the pad array 146. In other words, the DSP 14 and the memory 15 are disposed on the third substrate 140 in such a manner that signals read to the pad array 146 flow from upstream to downstream while it is assumed that the pad array 146 to which the signals output from the signal processing section 13 on the second substrate 120 are input is on an upstream side and that a side physically apart from the pad array 146 is a downstream side.

Moreover, the electromagnetic shield 141 is provided between a region where the DSP 14 is provided on the third substrate 140 and the second substrate 120. By providing the electromagnetic shield 141 that covers the DSP 14 in this way, it is possible to reduce the penetration of the noise generated by executing the signal processing by the DSP 14 into the pixel array section 101. As a result, even in the case in which the DSP 14 is actuated as the processing section that executes the computing processing based on the learned model, it is possible to reduce the penetration of the noise resulting from the signal processing by the DSP 14 into the pixel array section 101, and therefore possible to acquire an image with the reduced degradation in quality.

It is to be noted that an insertion position of the electromagnetic shield 141 is not limited to a position between the second substrate 120 and the third substrate 140 and may be a position between the first substrate 100 and the second substrate 120. Further, the electromagnetic shield 141 does not necessarily cover the entire DSP 14, and it is sufficient that the electromagnetic shield 141 covers at least part of the DSP 14.

As a scheme for connection of the TSV arrays 102 and 105 on the first substrate 100 to the interconnections 122 and 125 on the second substrate 120, for example, what is called a twin TSV scheme for connecting the two types of TSVs, that is, the TSVs provided on the first substrate 100 and the TSVs provided in a range of the first substrate 100 to the second substrate 120, on a chip outer surface, or what is called a shared TSV scheme for connection by use of common TSVs provided in the range of the first substrate 100 to the second substrate 120, can be adopted. It is to be noted, however, that the connection form is not limited to these schemes, and any of various connection forms including, for example, what is called a Cu—Cu bonding scheme for joining copper (Cu) exposed on the junction surface of the first substrate 100 with cupper exposed on the junction surface of the second substrate 120 can be adopted.

Further, for connection between the respective pads in the pad array 103 on the first substrate 100, the respective pads in the pad array 123 on the second substrate 120, and the respective pads in the pad array 143 on the third substrate 140, a wire bonding scheme, for example, can be adopted. It is to be noted, however, that the connection form is not limited to this scheme, and any of various connection forms including, for example, a through-hole form and a castellation form can be adopted.

Moreover, for connection of the pad array 126 on the rear surface of the second substrate 120 to the pad array 146 on the third substrate 140, the Cu—Cu bonding, for example, can be used. It is to be noted, however, that the connection form is not limited to this scheme, and any of various connection forms including, for example, the twin TSV scheme and the shared TSV scheme described above can be adopted.

1.3.1.4 Modification of First Floor Map

It is also possible to adopt a configuration arranged such that the second substrate 120 and the third substrate 140 in FIG. 3 are replaced with each other. In that case, the DSP 14 and the memory 15 are disposed on the second substrate 120, while the analog circuit 201 and the logic circuit 202 are disposed on the third substrate 140. Further, the electromagnetic shield 141 is disposed between the first substrate 100 and the second substrate 120 and above the DSP 14 and the memory 15. It is to be noted that the electromagnetic shield 141 is only required to be disposed at a position corresponding to at least part of the DSP 14.

1.3.2 Second Floor Map Example

Figure 7:
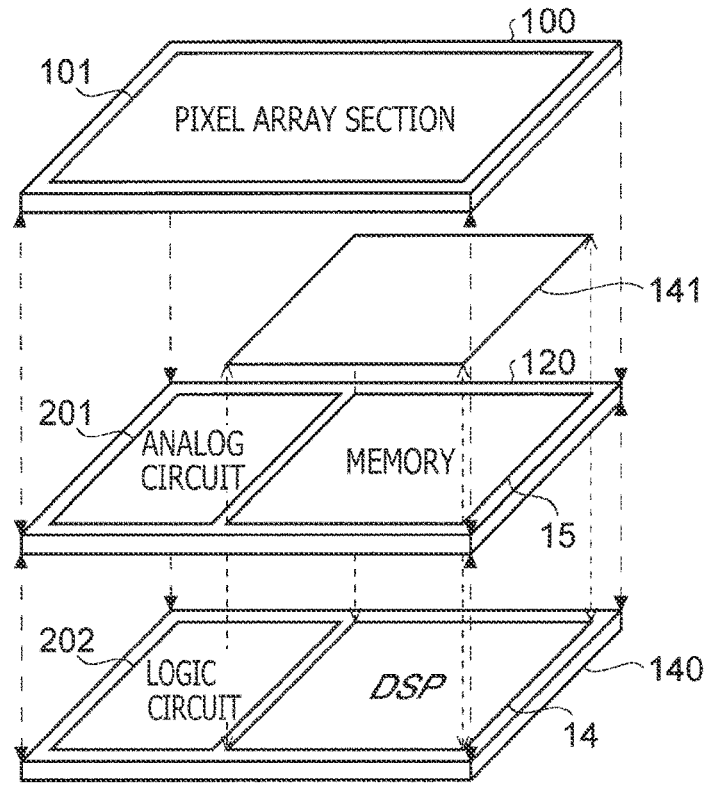
FIG. 7 is an explanatory diagram of a second floor map example according to the first embodiment.

A second floor map example will next be described. FIG. 7 is an explanatory diagram of the second floor map example. As depicted in FIG. 7, in the second floor map example, the pixel array section 101 is disposed on the first substrate 100, the analog circuit 201 and the memory 15 are disposed on the second substrate 120, and the logic circuit 202 and the DSP 14 are disposed on the third substrate 140. Further, the electromagnetic shield 141 is disposed between the first substrate 100 and the second substrate 120 and above the DSP 14 and the memory 15. At that time, it is possible to reduce a range in which the electromagnetic shield 141 is provided, by disposing the DSP 14 and the memory 15 in corresponding regions in a vertical direction. It is to be noted, however, that it is sufficient to dispose the electromagnetic shield 141 at a position corresponding to at least part of the DSP 14. Further, the electromagnetic shield 141 may be disposed between the second substrate 120 and the third substrate 140.

With such a configuration, the analog pixel signal read from each unit pixel 101a in the pixel array section 101 is input to the analog circuit 201 on the second substrate 120 via, for example, the TSV array 102 provided on the first substrate 100, and is converted into the digital pixel signal, and the digital pixel signal is then input to the logic circuit 202 on the third substrate 140.

As described above, it is also possible to adopt the configuration in such a manner as to dispose the analog circuit 201 on the second substrate 120 and to dispose the logic circuit 202 on the third substrate 140.

1.3.2.1 Modification of Second Floor Map

It is also possible to adopt a configuration arranged such that the second substrate 120 and the third substrate 140 in FIG. 7 are replaced with each other. In that case, the logic circuit 202 and the DSP 14 are disposed on the second substrate 120, while the analog circuit 201 and the memory 15 are disposed on the third substrate 140. Further, the electromagnetic shield 141 is disposed between the first substrate 100 and the second substrate 120 and above the DSP 14 and the memory 15. It is to be noted that the electromagnetic shield 141 is only required to be disposed at a position corresponding to at least part of the DSP 14.

1.3.3 Third Floor Map Example

Figure 8:
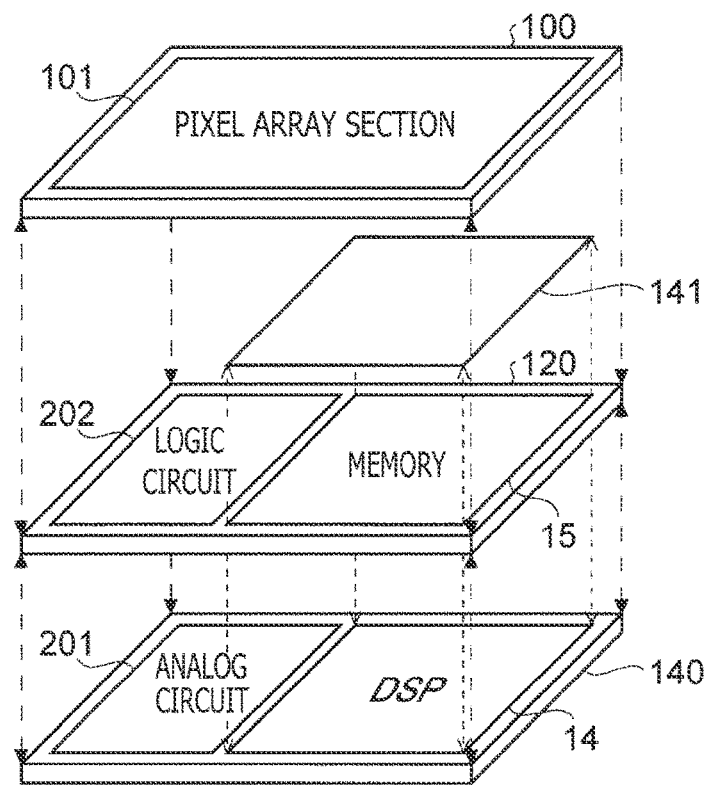
FIG. 8 is an explanatory diagram of a third floor map example according to the first embodiment.

A third floor map example will next be described. FIG. 8 is an explanatory diagram of the third floor map example. As depicted in FIG. 8, in the third floor map example, the pixel array section 101 is disposed on the first substrate 100, the logic circuit 202 and the memory 15 are disposed on the second substrate 120, and the analog circuit 201 and the DSP 14 are disposed on the third substrate 140. Further, the electromagnetic shield 141 is disposed between the first substrate 100 and the second substrate 120 and above the DSP 14 and the memory 15. At that time, it is possible to reduce the range in which the electromagnetic shield 141 is provided, by disposing the DSP 14 and the memory 15 in the corresponding regions in the vertical direction. It is to be noted, however, that it is sufficient to dispose the electromagnetic shield 141 at a position corresponding to at least part of the DSP 14. Further, the electromagnetic shield 141 may be disposed between the second substrate 120 and the third substrate 140.

With such a configuration, the analog pixel signal read from each unit pixel 101a in the pixel array section 101 is input to the analog circuit 201 on the third substrate 140 via, for example, the TSV array 102 provided on the first substrate 100 and TSVs that are not depicted and that are provided on the second substrate 120, and is converted into the digital pixel signal, and the digital pixel signal is then input to the logic circuit 202 on the second substrate 120.

As described above, it is also possible to adopt the configuration in such a manner as to dispose the analog circuit 201 on the third substrate 140 and to dispose the logic circuit 202 on the second substrate 120.

1.3.3.1 Modification of Third Floor Map

It is also possible to adopt a configuration arranged such that the second substrate 120 and the third substrate 140 in FIG. 8 are replaced with each other. In that case, the analog circuit 201 and the DSP 14 are disposed on the second substrate 120, while the logic circuit 202 and the memory 15 are disposed on the third substrate 140. Further, the electromagnetic shield 141 is disposed between the first substrate 100 and the second substrate 120 and above the DSP 14 and the memory 15. It is to be noted that the electromagnetic shield 141 is only required to be disposed at a position corresponding to at least part of the DSP 14.

1.3.4 Fourth Floor Map Example

Figure 9:
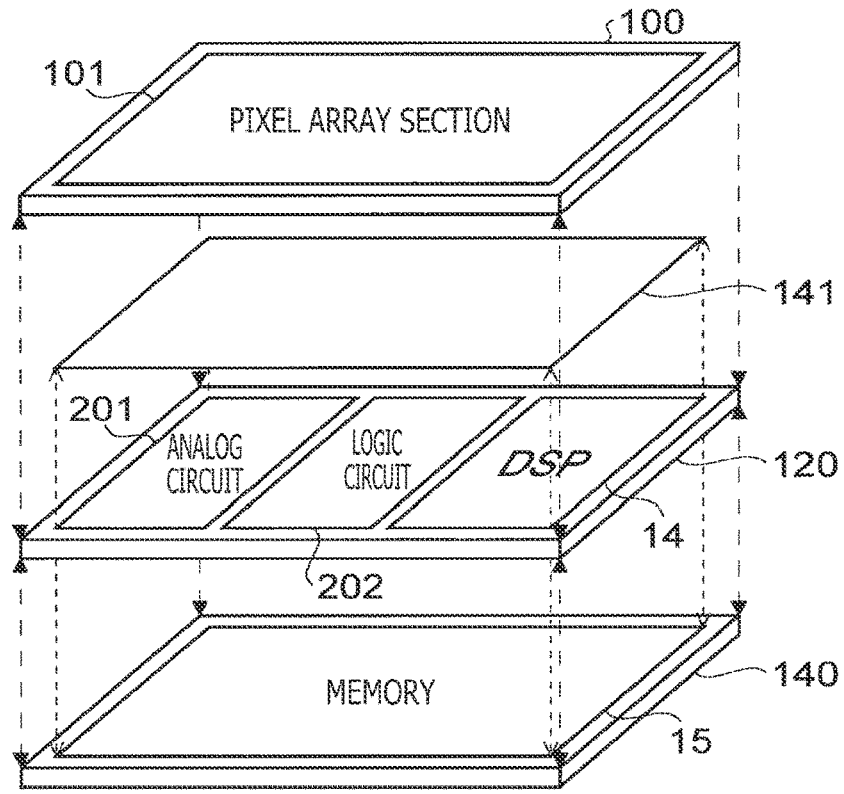
FIG. 9 is an explanatory diagram of a fourth floor map example according to the first embodiment.

A fourth floor map example will next be described. FIG. 9 is an explanatory diagram of the fourth floor map example. As depicted in FIG. 9, in the fourth floor map example, the pixel array section 101 is disposed on the first substrate 100, the analog circuit 201, the logic circuit 202, and the DSP 14 are disposed on the second substrate 120, and the memory 15 is disposed on the third substrate 140. Further, the electromagnetic shield 141 is disposed between the first substrate 100 and the second substrate 120 and above the DSP 14 and the memory 15. It is to be noted that the electromagnetic shield 141 is only required to be disposed at a position corresponding to at least part of the DSP 14.

With such a configuration, the analog pixel signal read from each unit pixel 101a in the pixel array section 101 is input to the analog circuit 201 on the second substrate 120 via, for example, the TSV array 102 provided on the first substrate 100, and is converted into the digital pixel signal, and the digital pixel signal is then input to the logic circuit 202 on the same second substrate 120.

As described above, it is also possible to adopt the configuration in such a manner as to dispose, among the analog circuit 201, the logic circuit 202, the DSP 14, and the memory 15, the memory 15 on the third substrate 140 and to dispose the constituent elements other than the memory 15 on the second substrate 120.

1.3.4.1 Modification of Fourth Floor Map

It is also possible to adopt a configuration arranged such that the second substrate 120 and the third substrate 140 in FIG. 9 are replaced with each other. In that case, the memory 15 is disposed on the second substrate 120, while the analog circuit 201, the logic circuit 202, and the DSP 14 are disposed on the third substrate 140. Further, the electromagnetic shield 141 is disposed between the second substrate 120 and the third substrate 140 and above the DSP 14 and the memory 15. It is to be noted that the electromagnetic shield 141 is only required to be disposed at a position corresponding to at least part of the DSP 14. Alternatively, the electromagnetic shield 141 may be disposed between the first substrate 100 and the second substrate 120.

1.3.5 Fifth Floor Map Example

Figure 10:
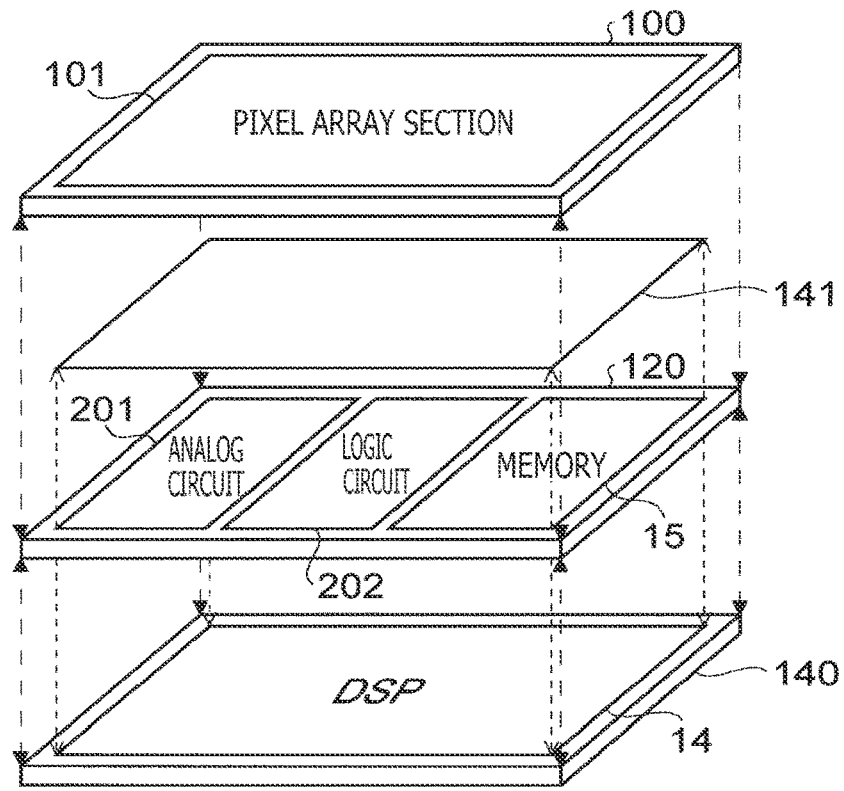
FIG. 10 is an explanatory diagram of a fifth floor map example according to the first embodiment.

A fifth floor map example will next be described. FIG. 10 is an explanatory diagram of the fifth floor map example. As depicted in FIG. 10, in the fifth floor map example, the pixel array section 101 is disposed on the first substrate 100, the analog circuit 201, the logic circuit 202, and the memory are disposed on the second substrate 120, and the DSP 14 is disposed on the third substrate 140. Further, the electromagnetic shield 141 is disposed between the first substrate 100 and the second substrate 120. It is to be noted that the electromagnetic shield 141 is only required to be disposed at a position corresponding to at least part of the DSP 14.

With such a configuration, the analog pixel signal read from each unit pixel 101a in the pixel array section 101 is input to the analog circuit 201 on the second substrate 120 via, for example, the TSV array 102 provided on the first substrate 100, and is converted into the digital pixel signal, and the digital pixel signal is then input to the logic circuit 202 on the same second substrate 120.

As described above, it is also possible to adopt the configuration in such a manner as to dispose, among the analog circuit 201, the logic circuit 202, the DSP 14, and the memory 15, the DSP 14 on the third substrate 140 and to dispose the constituent elements other than the DSP 14 on the second substrate 120.

1.3.5.1 Modification of Fifth Floor Map

It is also possible to adopt a configuration arranged such that the second substrate 120 and the third substrate 140 in FIG. 10 are replaced with each other. In that case, the DSP 14 is disposed on the second substrate 120, while the analog circuit 201, the logic circuit 202, and the memory 15 are disposed on the third substrate 140. Further, the electromagnetic shield 141 is disposed between the first substrate 100 and the second substrate 120. It is to be noted that the electromagnetic shield 141 is only required to be disposed at a position corresponding to at least part of the DSP 14.

1.3.6 Sixth Floor Map Example

Figure 11:
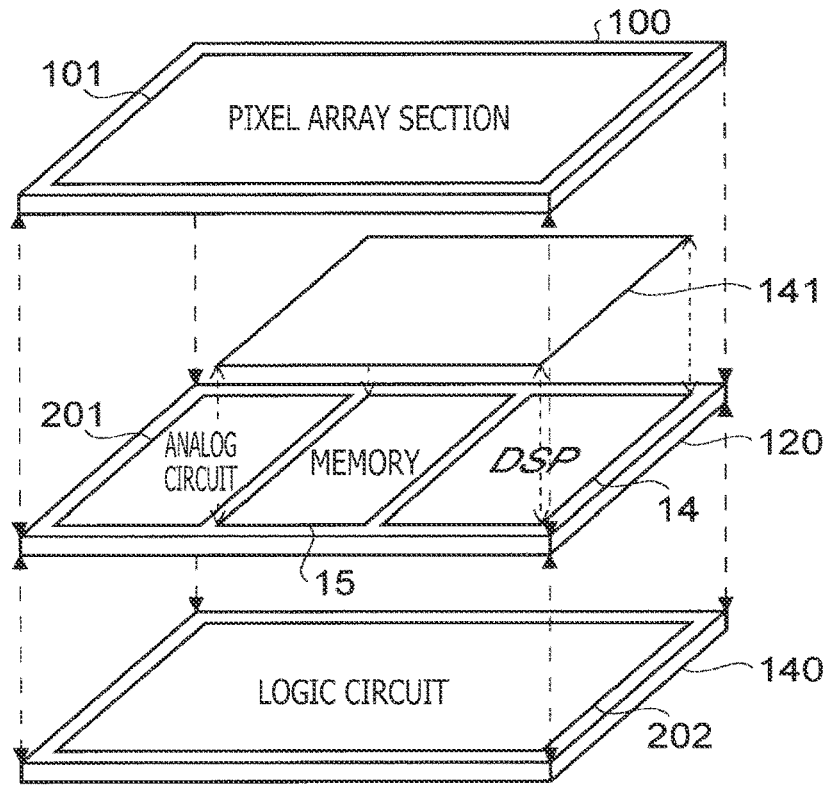
FIG. 11 is an explanatory diagram of a sixth floor map example according to the first embodiment.

A sixth floor map example will next be described. FIG. 11 is an explanatory diagram of the sixth floor map example. As depicted in FIG. 11, in the sixth floor map example, the pixel array section 101 is disposed on the first substrate 100, the analog circuit 201, the DSP 14, and the memory 15 are disposed on the second substrate 120, and the logic circuit 202 is disposed on the third substrate 140. Further, the electromagnetic shield 141 is disposed between the first substrate 100 and the second substrate 120 and above the DSP 14 and the memory 15. It is to be noted that the electromagnetic shield 141 is only required to be disposed at a position corresponding to at least part of the DSP 14.

With such a configuration, the analog pixel signal read from each unit pixel 101a in the pixel array section 101 is input to the analog circuit 201 on the second substrate 120 via, for example, the TSV array 102 provided on the first substrate 100, and is converted into the digital pixel signal, and the digital pixel signal is then input to the logic circuit 202 on the same second substrate 120.

As described above, it is also possible to adopt the configuration in such a manner as to dispose, among the analog circuit 201, the logic circuit 202, the DSP 14, and the memory 15, the logic circuit 202 on the third substrate 140 and to dispose the constituent elements other than the logic circuit 202 on the second substrate 120.

1.3.6.1 Modification of Sixth Floor Map

It is also possible to adopt a configuration arranged such that the second substrate 120 and the third substrate 140 in FIG. 11 are replaced with each other. In that case, the logic circuit 202 is disposed on the second substrate 120, while the analog circuit 201, the DSP 14, and the memory 15 are disposed on the third substrate 140. Further, the electromagnetic shield 141 is disposed between the second substrate 120 and the third substrate 140 and above the DSP 14 and the memory 15. It is to be noted that the electromagnetic shield 141 is only required to be disposed at a position corresponding to at least part of the DSP 14. Alternatively, the electromagnetic shield 141 may be disposed between the first substrate 100 and the second substrate 120.

1.3.7 Seventh Floor Map Example

Figure 12:
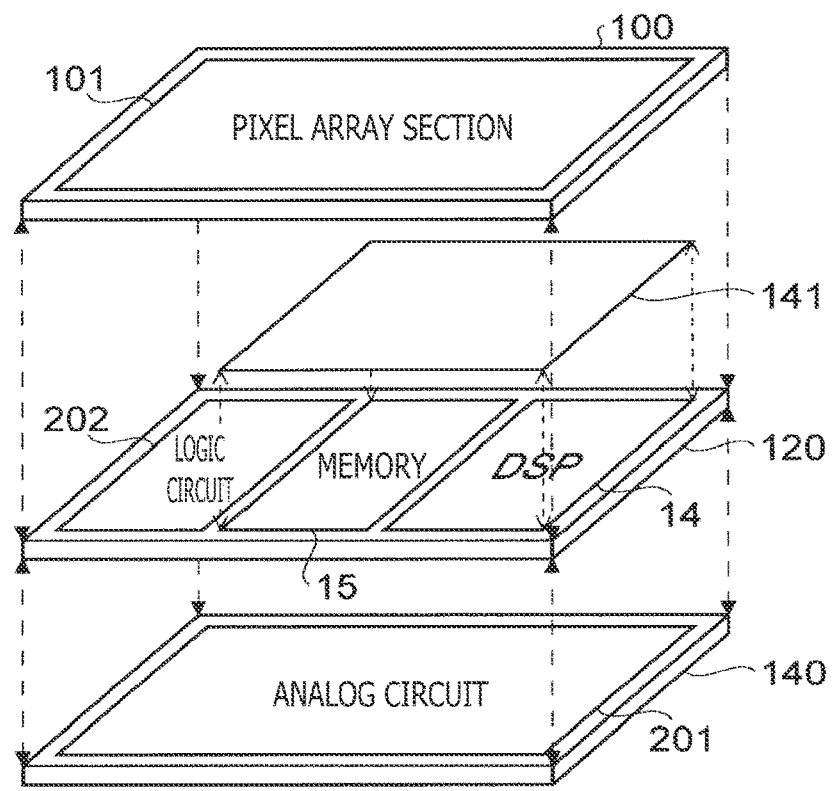
FIG. 12 is an explanatory diagram of a seventh floor map example according to the first embodiment.

A seventh floor map example will next be described. FIG. 12 is an explanatory diagram of the seventh floor map example. As depicted in FIG. 12, in the seventh floor map example, the pixel array section 101 is disposed on the first substrate 100, the logic circuit 202, the DSP 14, and the memory 15 are disposed on the second substrate 120, and the analog circuit 201 is disposed on the third substrate 140. Further, the electromagnetic shield 141 is disposed between the first substrate 100 and the second substrate 120 and above the DSP 14 and the memory 15. It is to be noted that the electromagnetic shield 141 is only required to be disposed at a position corresponding to at least part of the DSP 14.

With such a configuration, the analog pixel signal read from each unit pixel 101a in the pixel array section 101 is input to the analog circuit 201 on the third substrate 140 via, for example, the TSV array 102 provided on the first substrate 100 and the TSVs that are not depicted and that are provided on the second substrate 120, and is converted into the digital pixel signal, and the digital pixel signal is then input to the logic circuit 202 on the second substrate 120.

As described above, it is also possible to adopt the configuration in such a manner as to dispose, among the analog circuit 201, the logic circuit 202, the DSP 14, and the memory 15, the analog circuit 201 on the third substrate 140 and to dispose the constituent elements other than the analog circuit 201 on the second substrate 120.

1.3.7.1 Modification of Seventh Floor Map

It is also possible to adopt a configuration arranged such that the second substrate 120 and the third substrate 140 in FIG. 12 are replaced with each other. In that case, the analog circuit 201 is disposed on the second substrate 120, while the logic circuit 202, the DSP 14, and the memory 15 are disposed on the third substrate 140. Further, the electromagnetic shield 141 is disposed between the second substrate 120 and the third substrate 140 and above the DSP 14 and the memory 15. It is to be noted that the electromagnetic shield 141 is only required to be disposed at a position corresponding to at least part of the DSP 14. Alternatively, the electromagnetic shield 141 may be disposed between the first substrate 100 and the second substrate 120.

1.3.8 Eighth Floor Map Example

Figure 13:
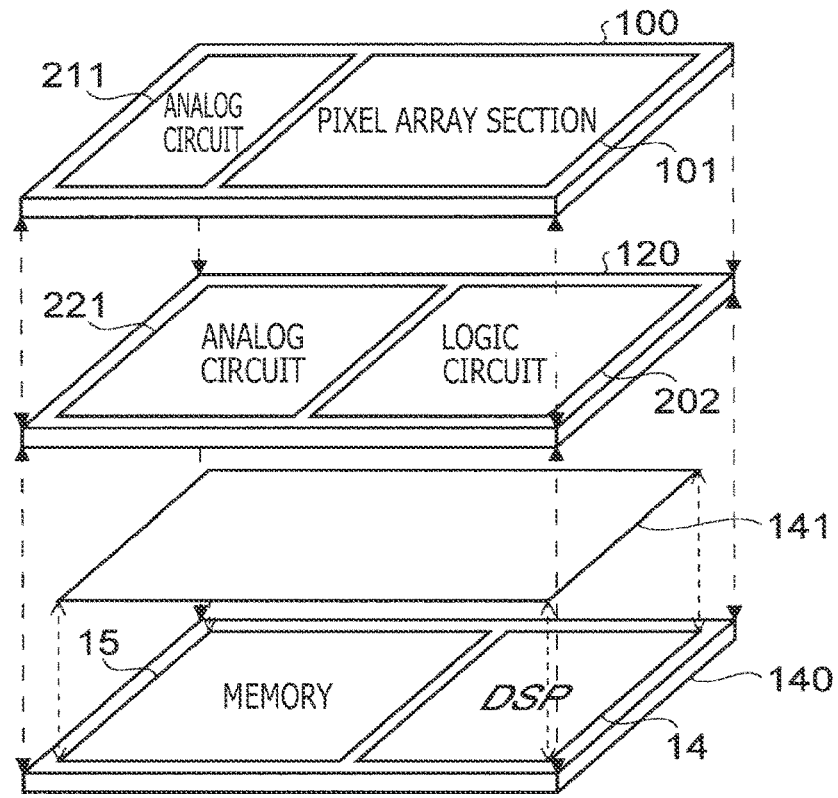
FIG. 13 is an explanatory diagram of an eighth floor map example according to the first embodiment.

An eighth floor map example will next be described. FIG. 13 is an explanatory diagram of the eighth floor map example. As depicted in FIG. 13, in the eighth floor map example, the pixel array section 101 and an analog circuit 211 that is part of the analog circuit 201 are disposed on the first substrate 100, an analog circuit 221 that is the remaining part of the analog circuit 201 and the logic circuit 202 are disposed on the second substrate 120, and the DSP 14 and the memory 15 are disposed on the third substrate 140. Further, the electromagnetic shield 141 is disposed between the second substrate 120 and the third substrate 140 and above the DSP 14 and the memory 15. It is to be noted that the electromagnetic shield 141 is only required to be disposed at a position corresponding to at least part of the DSP 14. Alternatively, the electromagnetic shield 141 may be disposed between the first substrate 100 and the second substrate 120.

With such a configuration, the analog pixel signal read from each unit pixel 101a in the pixel array section 101 is input to the analog circuit 211 on the first substrate 100, then input to the analog circuit 221 on the second substrate 120 via, for example, the TSV array 102 provided on the first substrate 100, and converted into the digital pixel signal, and the digital pixel signal is then input to the logic circuit 202 on the same second substrate 120.

As described above, it is also possible to adopt the configuration in such a manner as to dispose part of the analog circuit 201 on the first substrate 100 and to dispose the remaining analog circuit 221 on the second substrate 120.

1.3.8.1 Modification of Eighth Floor Map

While an example of disposing the remaining analog circuit 221 on the second substrate 120 is depicted in FIG. 13, the layout is not limited to this example. In other words, the floor maps of the second substrate 120 and the third substrate 140 may have any of layouts similar to those described in the first to seventh floor map examples or the modifications thereof. In that case, the analog circuit 201 in any of the first to seventh floor map examples or the modifications thereof is replaced by the analog circuit 221.

1.3.9 Ninth Floor Map Example

Figure 14:
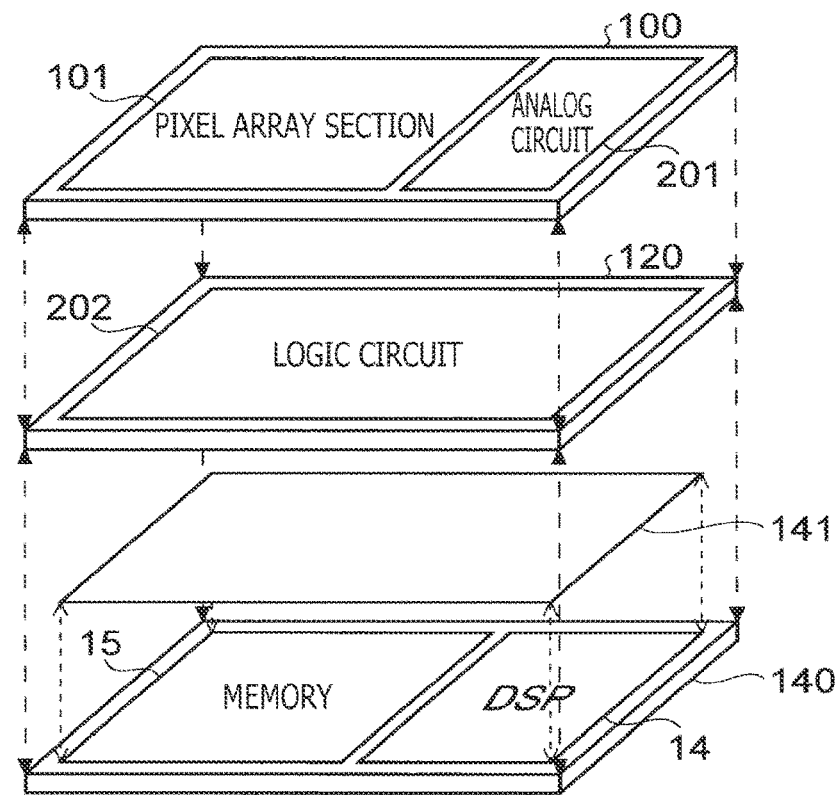
FIG. 14 is an explanatory diagram of a ninth floor map example according to the first embodiment.

A ninth floor map example will next be described. FIG. 14 is an explanatory diagram of the ninth floor map example. As depicted in FIG. 14, in the ninth floor map example, the pixel array section 101 and the analog circuit 201 are disposed on the first substrate 100, the logic circuit 202 is disposed on the second substrate 120, and the DSP 14 and the memory 15 are disposed on the third substrate 140. Further, the electromagnetic shield 141 is disposed between the second substrate 120 and the third substrate 140 and above the DSP 14 and the memory 15. It is to be noted that the electromagnetic shield 141 is only required to be disposed at a position corresponding to at least part of the DSP 14. Alternatively, the electromagnetic shield 141 may be disposed between the first substrate 100 and the second substrate 120.

With such a configuration, the analog pixel signal read from each unit pixel 101a in the pixel array section 101 is input to the analog circuit 201 on the first substrate 100, and is converted into the digital pixel signal, and the digital pixel signal is then input to the logic circuit 202 on the second substrate 120 via, for example, the TSV array 102 provided on the first substrate 100.

As described above, it is also possible to adopt the configuration in such a manner as to dispose the analog circuit 201 on the first substrate 100.

1.3.9.1 Modification of Ninth Floor Map

While an example of disposing the logic circuit 202 on the second substrate 120 and disposing the DSP 14 and the memory 15 on the third substrate 140 is depicted in FIG. 13, the layout is not limited to this example. In other words, one of the logic circuit 202, the DSP 14, or the memory 15 may be disposed on the second substrate 120.

In addition, it is also possible to adopt a configuration in such a manner as to dispose one of the logic circuit 202, the DSP 14, or the memory 15 on the third substrate 140 and to dispose the other constituent elements on the second substrate 120.

1.4 Advantages and Effects

As described so far, according to the present embodiment, it is possible to cause the DSP 14 to function as the processing section that executes the computing processing based on the learned model in the image sensor 10 of the three-layer structure. It is thereby possible to execute more highly advanced processing within the chip of the image sensor 10.

Further, in the present embodiment, the electromagnetic shield 141 that cuts off an electromagnetic wave as the noise is provided in at least part of a region between the pixel array section 101 disposed on the first substrate 100 and the DSP 14 disposed on the second substrate 120 or the third substrate 140. It is thereby possible to reduce the penetration of the noise resulting from the signal processing by the DSP 14 into the pixel array section 101; thus, even in the case in which the DSP 14 is actuated as the processing section that executes the computing processing based on the learned model, it is possible to acquire an image with the reduced degradation in quality.

2. Second Embodiment

A second embodiment will next be described in detail with reference to the drawings. It is to be noted that constituent elements similar to those in the first embodiment are denoted by the same reference signs and that repetitive description is omitted in the following description. Further, while a case based on the first floor map example in the first embodiment is exemplarily described in the following description, the present disclosure is not limited to this case, and it is possible to use the second to ninth floor map examples as a basis.

An imaging apparatus that serves as an electronic apparatus according to the second embodiment may be similar to, for example, the imaging apparatus 1 described with reference to FIG. 1 in the first embodiment; thus, detailed description of the imaging apparatus is omitted by referring to the imaging apparatus 1.

2.1 Example of Chip Configuration of Image Sensor Chip

Figure 15:
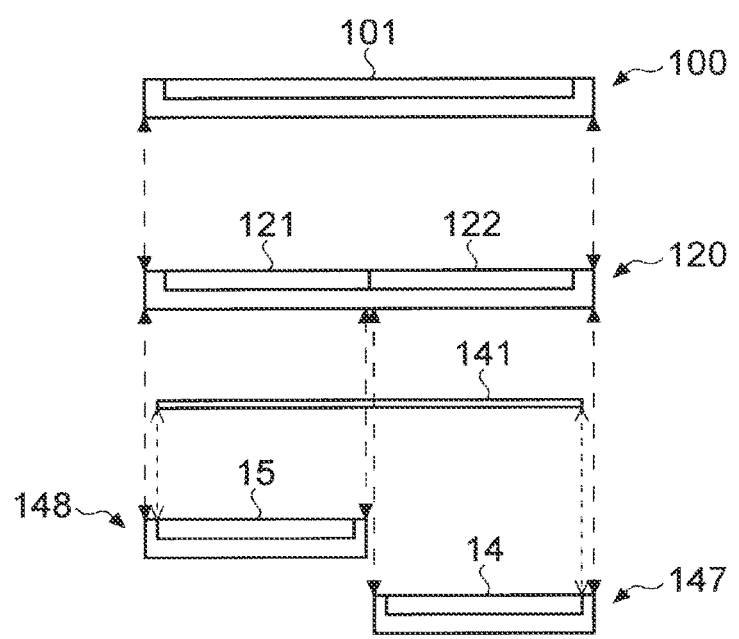
FIG. 15 is a schematic diagram depicting an example of a chip configuration of an image sensor according to a second embodiment.

An example of a chip configuration of an image sensor according to the present embodiment will next be described in detail with reference to the drawings. FIG. 15 is a schematic diagram depicting an example of the chip configuration of the image sensor according to the present embodiment.

In the present embodiment, as depicted in FIG. 15, the third substrate 140 according to the first floor map example of the first embodiment is divided into two substrates 147 and 148. The DSP 14, for example, is disposed on one substrate 147, while the memory 15, for example, is disposed on the other substrate 148. Further, the electromagnetic shield 141 is disposed between the second substrate 120 and the substrate 147 and above the DSP 14 and the memory 15. It is to be noted that the electromagnetic shield 141 is only required to be disposed at a position corresponding to at least part of the DSP 14. Alternatively, the electromagnetic shield 141 may be disposed between the first substrate 100 and the second substrate 120.

For the bonding of the second substrate 120 and the two substrates 147 and 148, the CoC (Chip on Chip) scheme for fragmenting each of the second substrate 120 and the substrates 147 and 148 into chips and then bonding these chips, or the CoW (Chip on Wafer) scheme for bonding the substrates 147 and 148 each fragmented into chips with the second substrate 120 in a wafer state can be adopted.

It is to be noted that locations where the substrates 147 and 148 are bonded with the second substrate 120 may be arranged such that the DSP 14 and the memory 15 are disposed with respect to the second substrate 120 similarly to the case with the first floor map example, for example.

2.2 Advantages and Effects

As described so far, it is possible to provide the DSP 14 and the memory 15 as separate chips. It is thereby possible to produce the DSP 14 and the memory 15 by separate manufacturing processes. It is to be noted that other configurations and effects may be similar to those of the first embodiment, and thus, detailed description thereof is omitted herein.

3. Third Embodiment

A third embodiment will next be described in detail with reference to the drawings. It is to be noted that constituent elements similar to those in the preceding embodiments are denoted by the same reference signs and that repetitive description is omitted in the following description.

An imaging apparatus that serves as an electronic apparatus according to the third embodiment may be similar to, for example, the imaging apparatus 1 described with reference to FIG. 1 in the first embodiment. However, for the sake of convenience of description, an example of a more detailed configuration of the image sensor 10 exemplarily depicted in FIG. 1 will be described first with reference to FIG. 16. It is to be noted that the optical system 104 in the imaging section 11 is not depicted in FIG. 16.

3.1 Example of Configuration of Image Sensor

Figure 16:
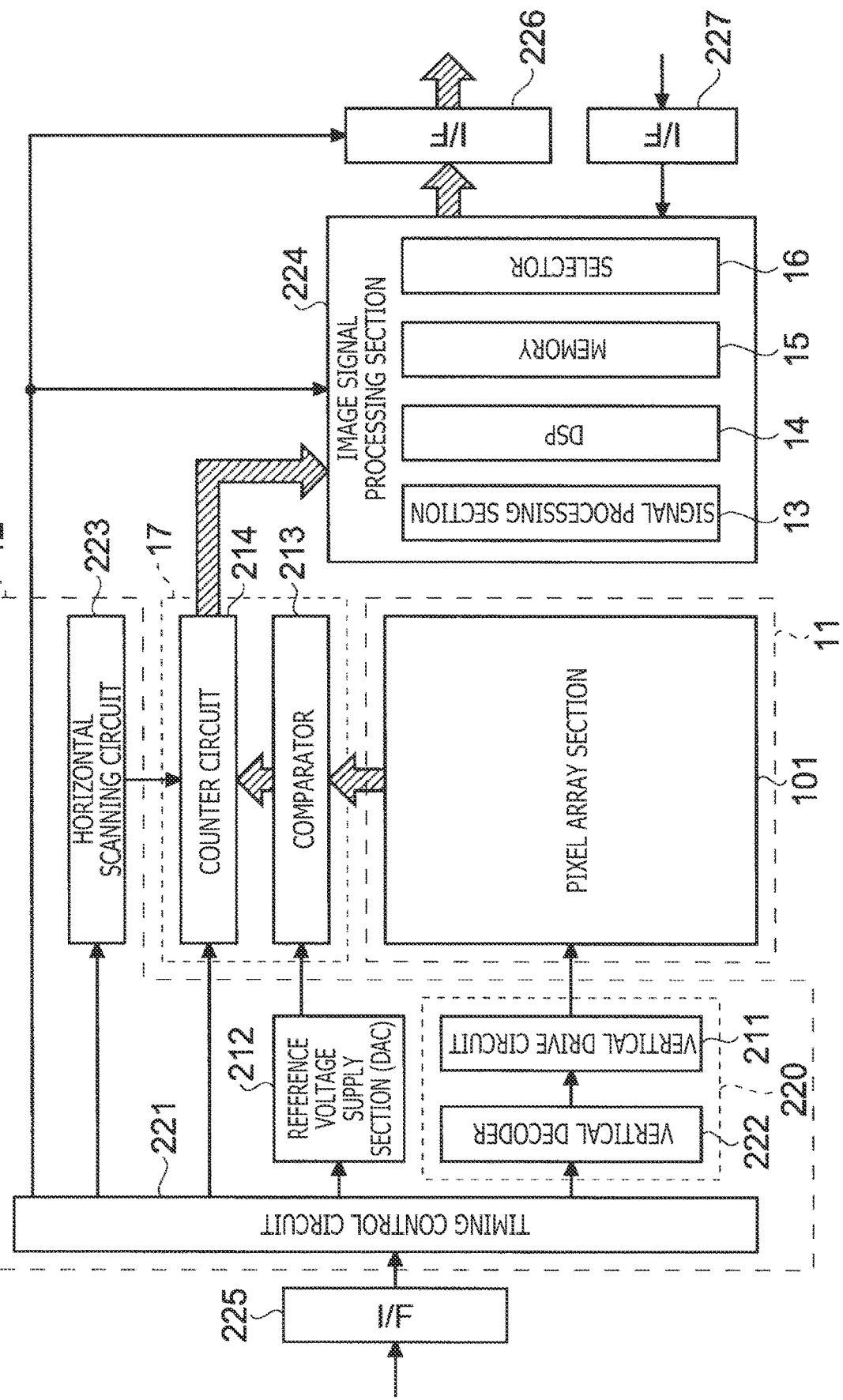
FIG. 16 is a block diagram depicting an example of a more detailed configuration of the image sensor exemplarily depicted in FIG. 1.

As depicted in FIG. 16, the control section 12 in the image sensor 10 includes, for example, a timing control circuit 221, a row drive section 220, a reference voltage supply section (DAC) 212, and a horizontal scanning circuit 223.

The timing control circuit 221 outputs an internal clock necessary for each section to operate, a pulse signal for giving timing at which each section starts operating, and the like. In addition, the timing control circuit 221 receives data regarding commands of the master clock, the operation mode, and the like from the outside, and outputs data containing information regarding the image sensor 10.

For example, the timing control circuit 221 outputs a pulse signal for giving timing of reading a pixel signal from each unit pixel 101a, to a vertical drive circuit 211. Further, the timing control circuit 221 outputs, to the horizontal scanning circuit 223, a column address signal for sequentially reading the pixel signals converted into digital values by the ADC 17 from the ADC 17 per column.

In addition, the timing control circuit 221 supplies, as internal clocks, a clock with the same frequency as a frequency of the master clock input from the outside, a clock with a half frequency of the master clock, low speed clocks with frequencies obtained by further dividing the frequency of the master clock into three or more, and the like to the respective sections within the image sensor 10, such as the row drive section 220, the reference voltage supply section 212, the ADC 17, and the horizontal scanning circuit 223. The clock with the half frequency and the clocks with lower frequencies will collectively be referred to as "low speed clocks," hereinafter.

The row drive section 220 selects, for example, one of rows of the unit pixels 101a arranged two-dimensionally in a matrix in the pixel array section 101, and outputs a pulse necessary to drive the row (hereinafter, referred to as a "read row"). Therefore, the row drive section 220 includes, for example, a vertical decoder 222 that specifies the read row (that selects a row in the pixel array section 101), and the vertical drive circuit 211 that supplies a pulse to a pixel drive line corresponding to the unit pixels 101a on a read address (in a row direction) specified by the vertical decoder 222 to drive the unit pixels 101a. It is to be noted that the vertical decoder 222 may select not only the row from which the pixel signals are to be read but also a row for an electronic shutter and the like.

The reference voltage supply section 212 supplies a reference voltage for converting an analog pixel signal read from each unit pixel 101a into a digital pixel signal, to the ADC 17. In a case, for example, in which the ADC 17 is a single-slope ADC, the reference voltage supply section 212 outputs a reference voltage having a sawtooth (also referred to as "ramp") waveform and stepping up or stepping down either linearly or step-wise. On the other hand, in a case in which the ADC 17 is a successive approximation ADC, the reference voltage supply section 212 outputs a reference voltage having a constant voltage value. In that case, each ADC 17 generates a plurality of reference voltages for uses in successive approximation by, for example, dividing the reference voltage that is a constant voltage.

FIG. 16 depicts the single-slope ADC 17. The single-slope ADC 17 includes, for example, a comparator 213 and a counter 214. The comparator 212 compares a voltage value of the analog pixel signal read from each unit pixel 101a with the ramp reference voltage supplied from the reference voltage supply section 212, and outputs a result of the comparison to the counter 214. The counter 214 counts the number of clocks input from the timing control circuit 221 until the voltage value of the analog pixel signal exceeds or falls below the reference voltage, and sets a count value as a digital value of the pixel signal. It is to be noted that, in a case in which the ADC 17 is the successive approximation ADC, the ADC 17 includes, for example, a comparator, a capacitive DAC, a register, and a subtracter.

For example, according to a column address signal input from the timing control circuit 221, the horizontal scanning circuit 223 executes a shift operation (scanning) for reading image data including digital pixel signals from the ADC 17 corresponding to a read column designated by the column address signal, to a horizontal signal line. The read image data is input to an image signal processing section 224.

The image signal processing section 224 includes, for example, the signal processing section 13, the DSP 14, the memory 15, and the selector 16. Since operations of the signal processing section 13, the DSP 14, the memory 15, and the selector 16 may be similar to those described in the first embodiment, detailed description thereof is omitted herein.

The image sensor 10 also includes an interface (I/F) 225 that inputs/outputs the master clock and various types of data between the outside and the timing control circuit 221, an I/F 226 that outputs, to the application processor 20, the image data output via the selector 16, and an I/F 227 that receives the program, the dictionary coefficient, and the like used for executing the computing processing based on the learned model, as an input from peripheral sections.

With the above configuration, the vertical drive circuit 211, the reference voltage supply section 212, the comparator 213, and the counter 214 are included in, for example, the analog circuit 201. On the other hand, the timing control circuit 221, the vertical decoder 222, the horizontal scanning circuit 223, the image signal processing section 224, and the various I/Fs 225 to 227 are included in, for example, the logic circuit 202.

3.2 Floor Map Examples

Next, floor maps of respective layers in the image sensor 10 according to the present embodiment will be described while referring to several examples. It is to be noted that it is assumed that an example of a chip configuration of the image sensor 10 according to the present embodiment is, for example, a three-layer stacked structure including the first substrate to the third substrate, similarly to the stacked structure described with reference to FIG. 2 in the first embodiment.

3.2.1 First Floor Map Example

Figure 17:
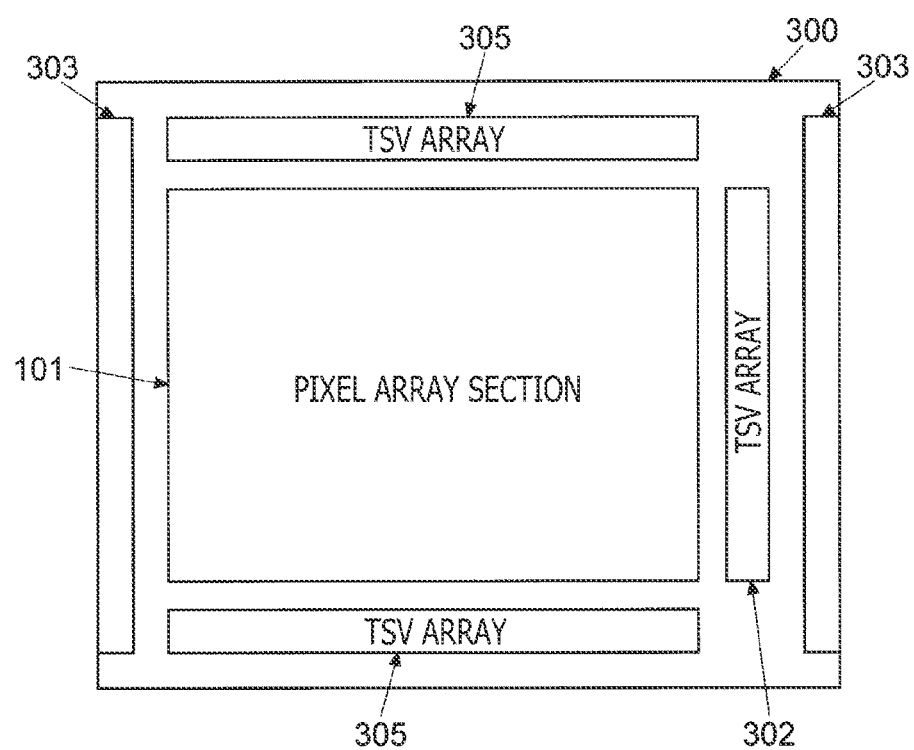
FIG. 17 is a diagram depicting a floor map example of a first substrate according to a first floor map example of a third embodiment.
Figure 18:
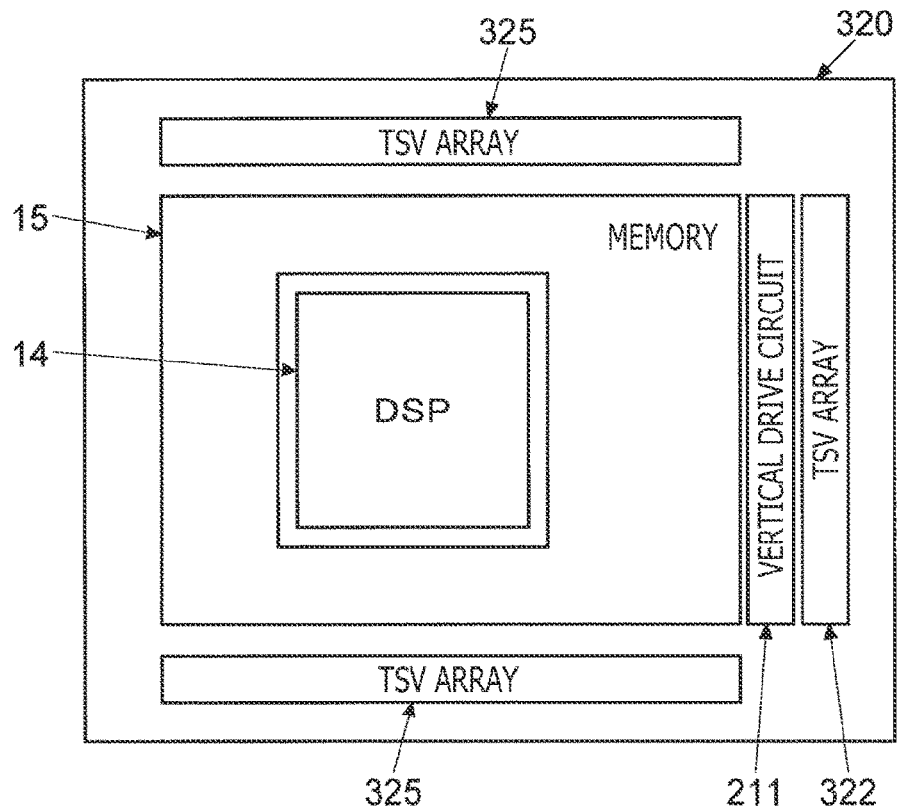
FIG. 18 is a diagram depicting a floor map example of a second substrate according to the first floor map example of the third embodiment.
Figure 19:
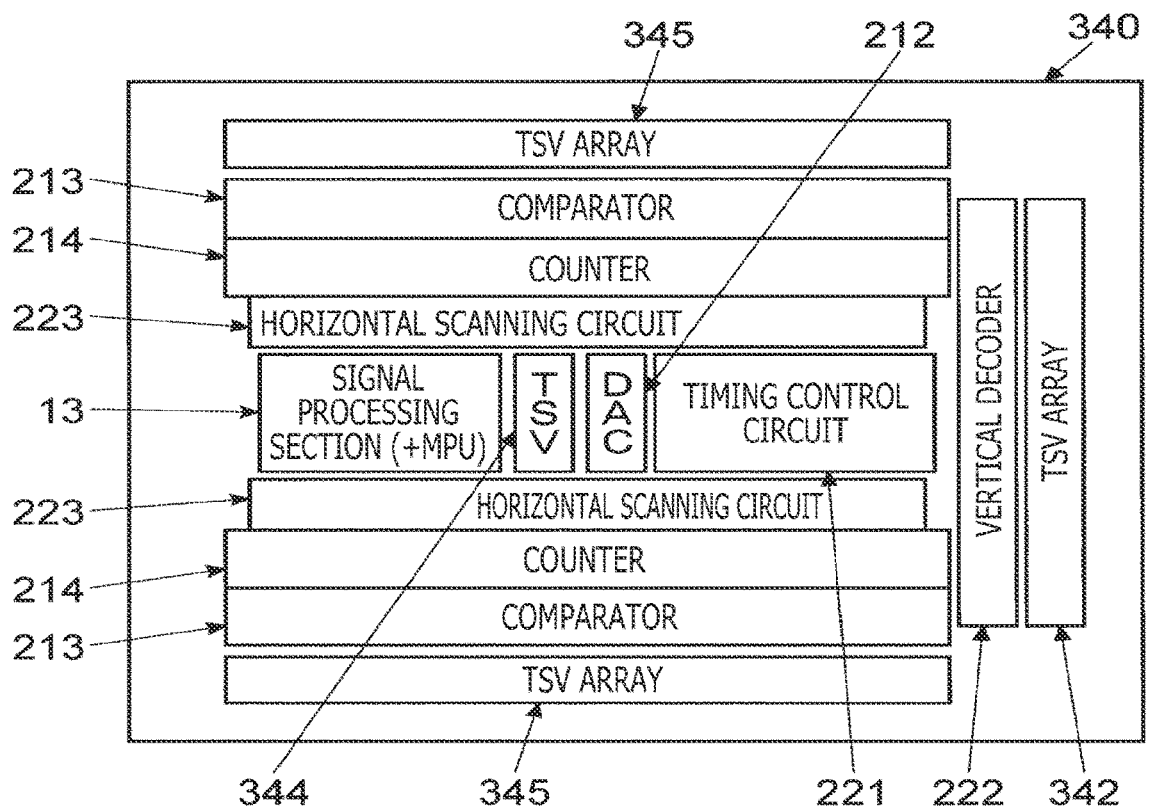
FIG. 19 is a diagram depicting a floor map example of a third substrate according to the first floor map example of the third embodiment.

FIGS. 17 to 19 are explanatory diagrams of a first floor map example according to the present embodiment. It is to be noted that FIG. 17 depicts a floor map example of a first substrate 300 that is the first layer, FIG. 18 depicts a floor map example of a second substrate 320 that is the second layer, and FIG. 19 depicts a floor map example of a third substrate 340 that is the third layer.

3.2.1.1 Floor Map Example of First Substrate

As depicted in FIG. 17, the first substrate 300 includes the pixel array section 101 disposed in most of an element formation surface of the first substrate 300, similarly to the first substrate 100 depicted in FIG. 4. It is to be noted that part of or entirety of the optical system 104 is provided at the position corresponding to the pixel array section 101 in a case of mounting part of or entirety of the optical system 104 on the first substrate 300.

Around the pixel array section 101, TSV arrays 302 and 305 each having a plurality of TSVs arranged therein and passing through the first substrate 300 are provided as part of interconnections that electrically connect the unit pixels 101a in the pixel array section 101 to a circuit element disposed in the lower layer. In an example depicted in FIG. 17, among the TSV arrays surrounding the pixel array section 101 from three directions, the TSV array 302 is a TSV array that connects the respective unit pixels 101a in the pixel array section 101 to the vertical drive circuit 211 in the row drive section 220, and each TSV array 305 is a TSV array that connects the respective unit pixels 101a in the pixel array section 101 to the comparator 213 in the ADC 17.

Further, pad arrays 303 each including a plurality of pads arranged linearly are provided on an outer periphery outward of the TSV arrays 302 and 305. For example, in the example depicted in FIG. 17, the respective pad arrays 303 are provided in two opposite sides, among four sides of the first substrate 300.

It is to be noted that each pad array 303 includes pads (power supply pins) to which the power supply voltage for the analog circuit is applied, pads (power supply pins) to which the power supply voltage for the logic circuit is applied, and the like, similarly to the pad arrays 103 in the preceding embodiment. Further, each pad array 303 also possibly includes pads (signal pins) for the various interfaces, pads (signal pins) for input/output of the clock signal and the data, and the like. Each pad in the pad arrays 303 is electrically connected to, for example, the external power supply circuit and the external interface circuit via a wire. Preferably, the pad arrays 303 and the TSV arrays 302 and 305 are apart from one another sufficiently to such an extent that the influence of reflection of a signal from the wire connected to each pad in the pad arrays 303 is ignorable.

3.2.1.2 Floor Map Example of Second Substrate

As depicted in FIG. 18, TSV arrays 322 and 325 are provided on the second substrate 320. The TSV array 322 is electrically connected to the TSV array 302 passing through the first substrate 300 by coming in contact with the TSV array 302. Likewise, each TSV array 325 is electrically connected to the TSV array 305 passing through the first substrate 300 by coming in contact with the TSV array 305.

Further, the vertical drive circuit 211, the DSP 14, and the memory 15 are also disposed on the second substrate 320. The vertical drive circuit 211 is disposed, for example, at a position adjoining the TSV array 322 connected to the TSV array 302 on the first substrate 300.

The DSP 14 and the memory 15 are disposed, for example, in a region immediately under the pixel array section 101 on the first substrate 300. At that time, disposing the DSP 14 and the memory 15 in such a manner that the DSP 14 is surrounded by the memory 15 makes it possible to reduce dispersion (for example, a difference between the smallest length of the signal line and the largest length of the signal line) of lengths of signal lines connecting respective memory elements in the memory 15 to the DSP 14. It is thereby possible to reduce signal delays, reduce the signal propagation loss, improve the S/N ratio, and reduce the power consumption.

3.2.1.3 Floor Map Example of Third Substrate

As depicted in FIG. 19, TSV arrays 342 and 345 electrically connected to the TSV arrays 322 and 325 passing through the second substrate 320 by coming in contact with the TSV arrays 322 and 325 are provided on the third substrate 340.

Further, the vertical decoder 222, the comparator 213 and the counter 214 configuring the ADC 17, the horizontal scanning circuit 223, the pixel drive section 13, the timing control circuit 221, and the reference voltage supply section (DAC) 212 are also disposed on the third substrate 340. It is to be noted that the signal processing section 13 may include an MPU (Micro Processing Unit).

The vertical decoder 222 is disposed, for example, at a position adjoining the TSV array 342 connected to the TSV array 322 on the second substrate 320. In other words, the vertical decoder 222 is connected to the vertical drive circuit 211 on the second substrate 320 via the TSV array 342.

The comparator 213 and the counter 214 configuring the ADC 17 are sequentially disposed in the vicinity of each of the TSV arrays 345 connected to the pixel array section 101 via the TSV arrays 325 and 305. Therefore, the pixel signal read from the pixel array section 101 is input to the comparator 213 via the TSV arrays 305, 325, and 345.

The horizontal scanning circuit 223 is disposed on an output side of each counter 214. Further, in a region put between the horizontal scanning circuits 223, that is, near a center of the third substrate 340, the signal processing section 13, the reference voltage supply section (DAC) 212, and the timing control circuit 221 are disposed.

The signal processing section 13 is connected to the DSP 14 and the memory 15 on the second substrate 320 via, for example, a TSV 344 provided generally at the center of the third substrate 340.

3.2.1.4 Position of Electromagnetic Shield

In the stacked structures depicted in FIGS. 17 to 19, the electromagnetic shield 141 exemplarily depicted in the preceding embodiments is disposed, for example, between the first substrate 300 and the second substrate 320. The electromagnetic shield 141 is provided in a region where the electromagnetic shield 141 covers at least the entire DSP 14, such as an entire region between the first substrate 300 and the second substrate 320. By providing the electromagnetic shield 141 that covers the DSP 14 in this way, it is possible to reduce the penetration of the noise generated by executing the signal processing by the DSP 14 into the pixel array section 101. As a result, even in the case in which the DSP 14 is actuated as the processing section that executes the computing processing based on the learned model, it is possible to reduce the penetration of the noise resulting from the signal processing by the DSP 14 into the pixel array section 101, and therefore possible to acquire an image with the reduced degradation in quality. It is to be noted that the electromagnetic shield 141 does not necessarily cover the entire DSP 14 and is only required to cover at least part of the DSP 14.

3.2.1.5 Modification

While a case of disposing the DSP 14 and the memory 15 on the second substrate 320 and disposing the analog circuit 201 and the remaining logic circuit 202 on the third substrate 340 is exemplarily described in the first floor map example, it is also possible to replace the second substrate 320 and the third substrate 340 with each other. In that case, the electromagnetic shield 141 may be disposed between the first substrate 300 and the second substrate 320 or between the second substrate 320 and the third substrate 340 and in the region where the electromagnetic shield 141 covers at least the entire DSP 14.

3.2.2 Second Floor Map Example

Figure 20:
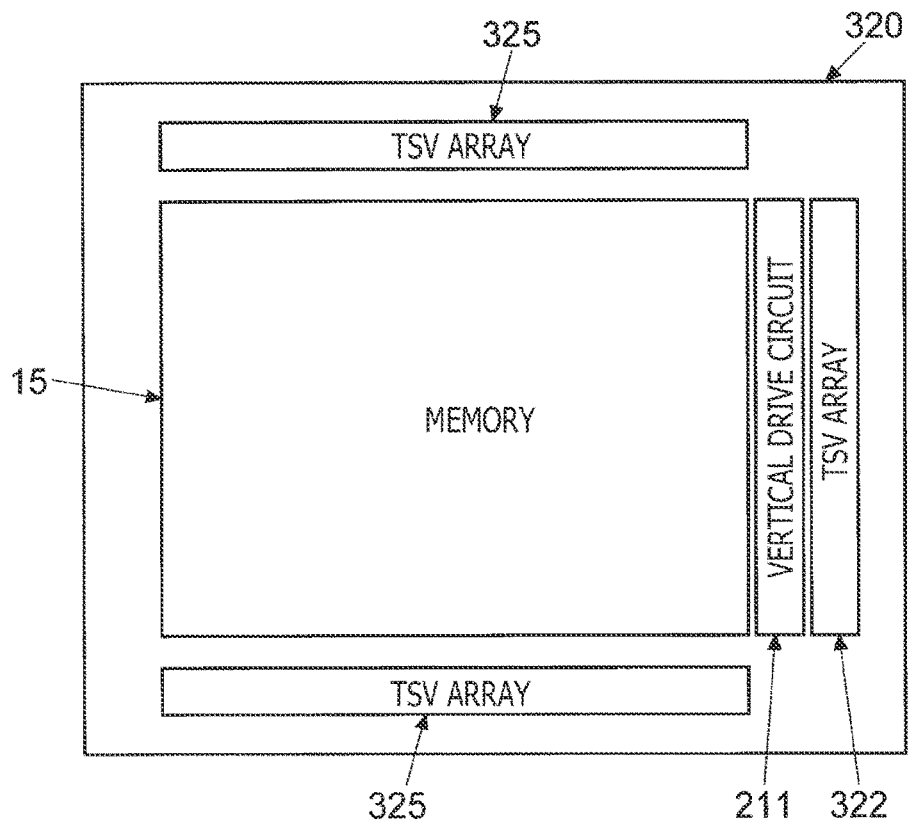
FIG. 20 is a diagram depicting a floor map example of a second substrate according to a second floor map example of the third embodiment.
Figure 21:
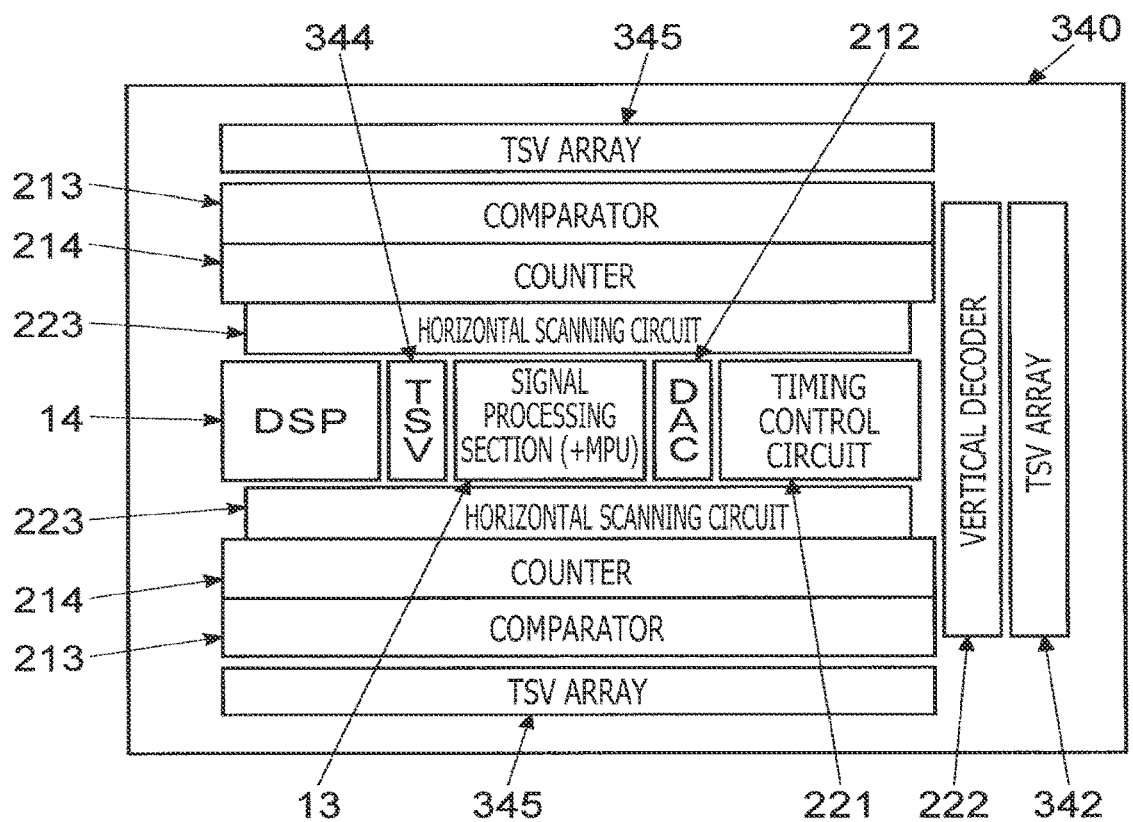
FIG. 21 is a diagram depicting a floor map example of a third substrate according to the second floor map example of the third embodiment.

A second floor map example will next be described in detail with reference to the drawings. FIG. 20 is diagram depicting a floor map example of the second substrate according to the second floor map example. FIG. 21 is diagram depicting a floor map example of the third substrate according to the second floor map example. It is to be noted that the floor map example of the first substrate 300 is not described herein in detail since the floor map example of the first substrate 300 may be similar to the floor map example described with reference to FIG. 17 in the first floor map example.

As depicted in FIGS. 20 and 21, in the second floor map example, the DSP 14, which is disposed on the second substrate 320 in the first floor map example, is disposed on the third substrate 340. The DSP 14 is disposed at a position at which the TSV 344 is put between the DSP 14 and the signal processing section 13, and connected to the memory 15 on the second substrate 320 via the TSV 344.

Further, the electromagnetic shield 141 is disposed, for example, between the first substrate 300 and the second substrate 320 or between the second substrate 320 and the third substrate 340 and in the region where the electromagnetic shield 141 covers at least the entire DSP 14, such as an entire region between the first substrate 300 and the second substrate 320 or an entire region between the second substrate 320 and the third substrate 340. By providing the electromagnetic shield 141 that covers the DSP 14 in this way, it is possible to reduce the penetration of the noise generated by executing the signal processing by the DSP 14 into the pixel array section 101, similarly to the first floor map example.

3.2.2.1 Modification

In the second floor map example, similarly to the first floor map example, the second substrate 320 and the third substrate 340 can be replaced with each other. In that case, the electromagnetic shield 141 may be disposed between the first substrate 300 and the second substrate 320 and in the region where the electromagnetic shield 141 covers at least the entire DSP 14.

3.2.3 Third Floor Map Example

Figure 22:
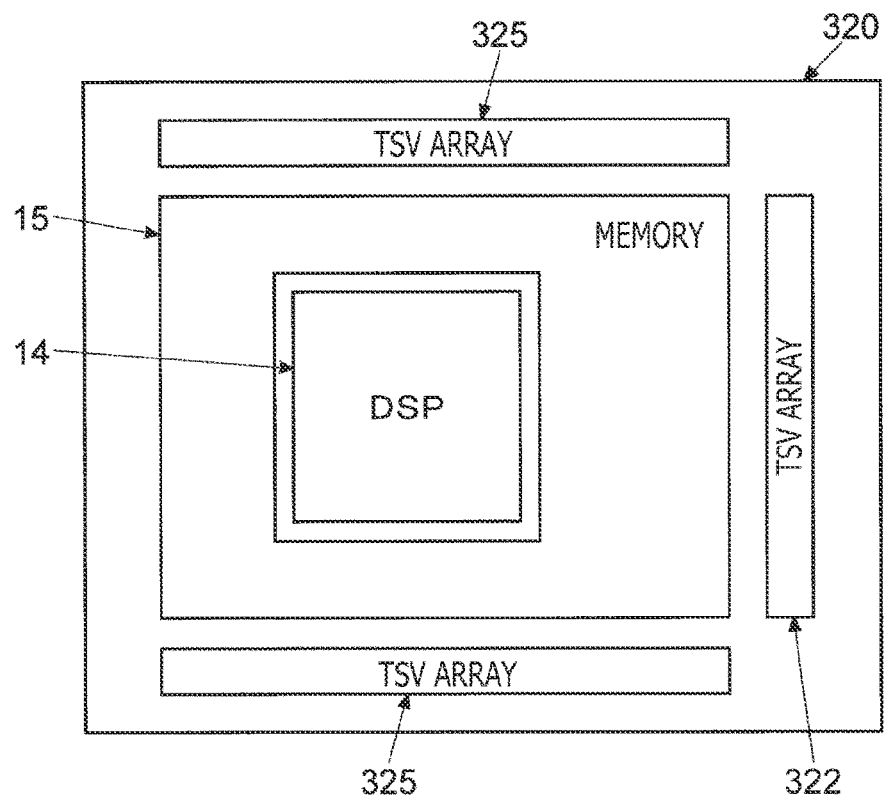
FIG. 22 is a diagram depicting a floor map example of a second substrate according to a third floor map example of the third embodiment.
Figure 23:
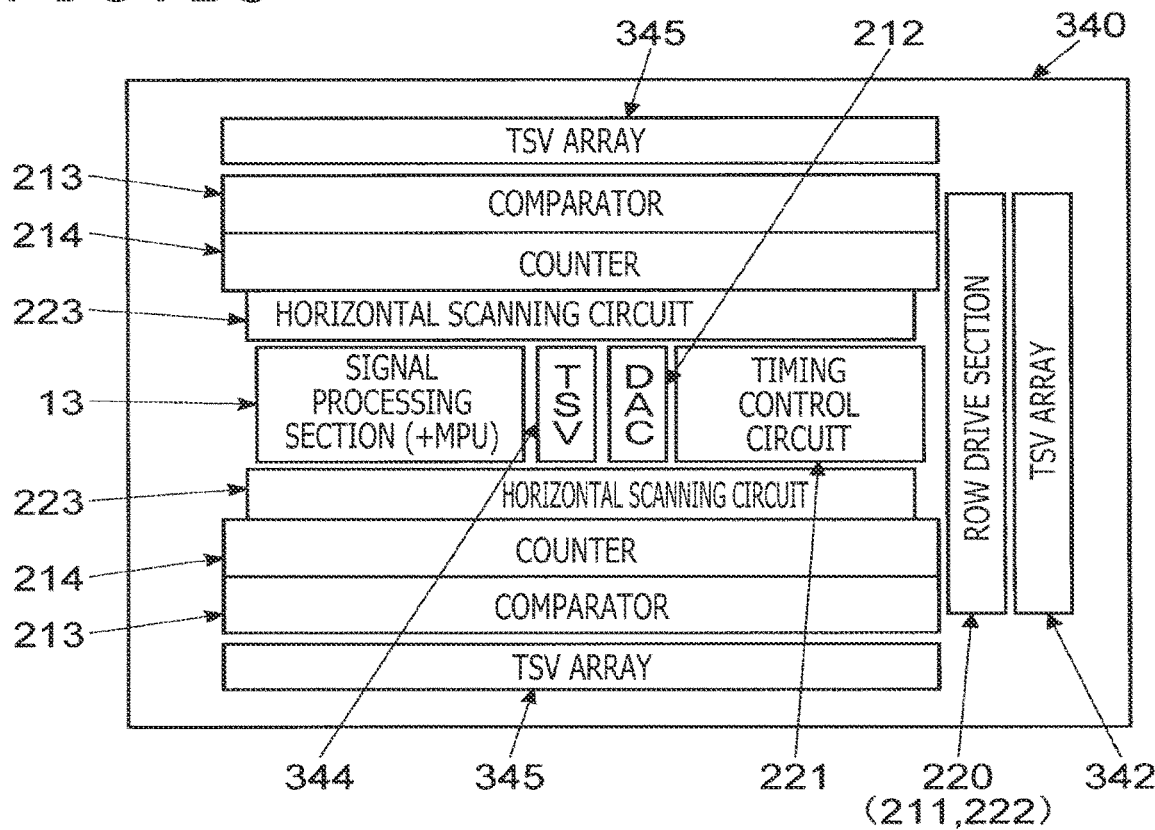
FIG. 23 is a diagram depicting a floor map example of a third substrate according to the third floor map example of the third embodiment.

A third floor map example will next be described in detail with reference to the drawings. FIG. 22 is diagram depicting a floor map example of the second substrate according to the third floor map example. FIG. 23 is diagram depicting a floor map example of the third substrate according to the third floor map example. It is to be noted that the floor map example of the first substrate 300 is not described herein in detail since the floor map example of the first substrate 300 may be similar to the floor map example described with reference to FIG. 17 in the first floor map example.

As depicted in FIGS. 22 and 23, in the third floor map example, the vertical drive circuit 211, which is disposed on the second substrate 320 in the first floor map example, is disposed on the third substrate 340. In other words, in the third floor map example, the row drive section 220 is disposed on the third substrate 340. The row drive section 220 is connected to the pixel array section 101 on the first substrate 300 via the TSV arrays 345, 325, and 305.

It is to be noted that the electromagnetic shield 141 may be disposed, for example, between the first substrate 300 and the second substrate 320 and in the region where the electromagnetic shield 141 covers at least the entire DSP 14, such as the entire region between the first substrate 300 and the second substrate 320, similarly to the first floor map example.

3.2.3.1 First Modification

In the third floor map example, similarly to the first and second floor map examples, the second substrate 320 and the third substrate 340 can be replaced with each other. In that case, the electromagnetic shield 141 may be disposed between the first substrate 300 and the second substrate 320 or between the second substrate 320 and the third substrate 340 and in the region where the electromagnetic shield 141 covers at least the entire DSP 14.

3.2.3.2 Second Modification

In addition, while a case based on the first floor map example depicted in FIGS. 18 and 19 is exemplarily depicted in FIGS. 22 and 23, the present disclosure is not limited to this case, and it is possible to use, for example, the second floor map example as a basis. In that case, by similarly disposing the vertical drive circuit 211, which is disposed on the second substrate 320, on the third substrate 340, the row drive section 220 is located on the third substrate 340.

3.2.4 Fourth Floor Map Example

Figure 24:
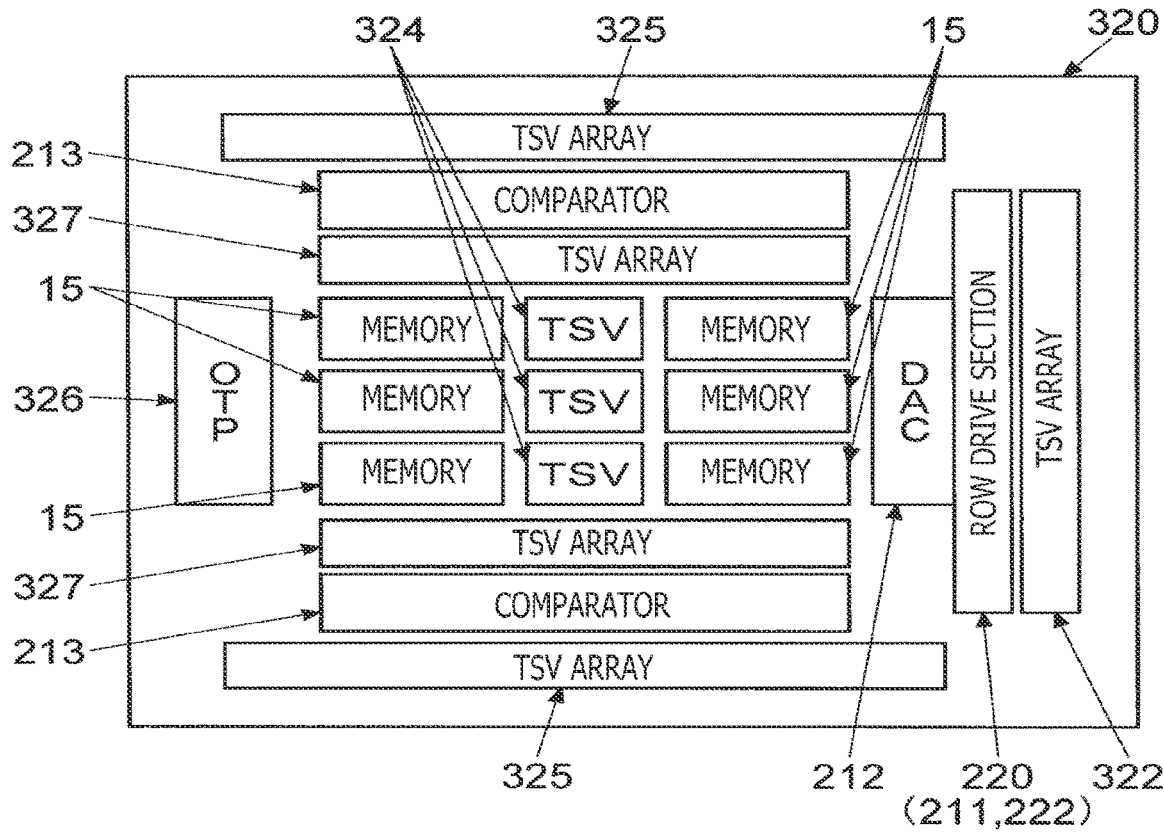
FIG. 24 is a diagram depicting a floor map example of a second substrate according to a fourth floor map example of the third embodiment.
Figure 25:
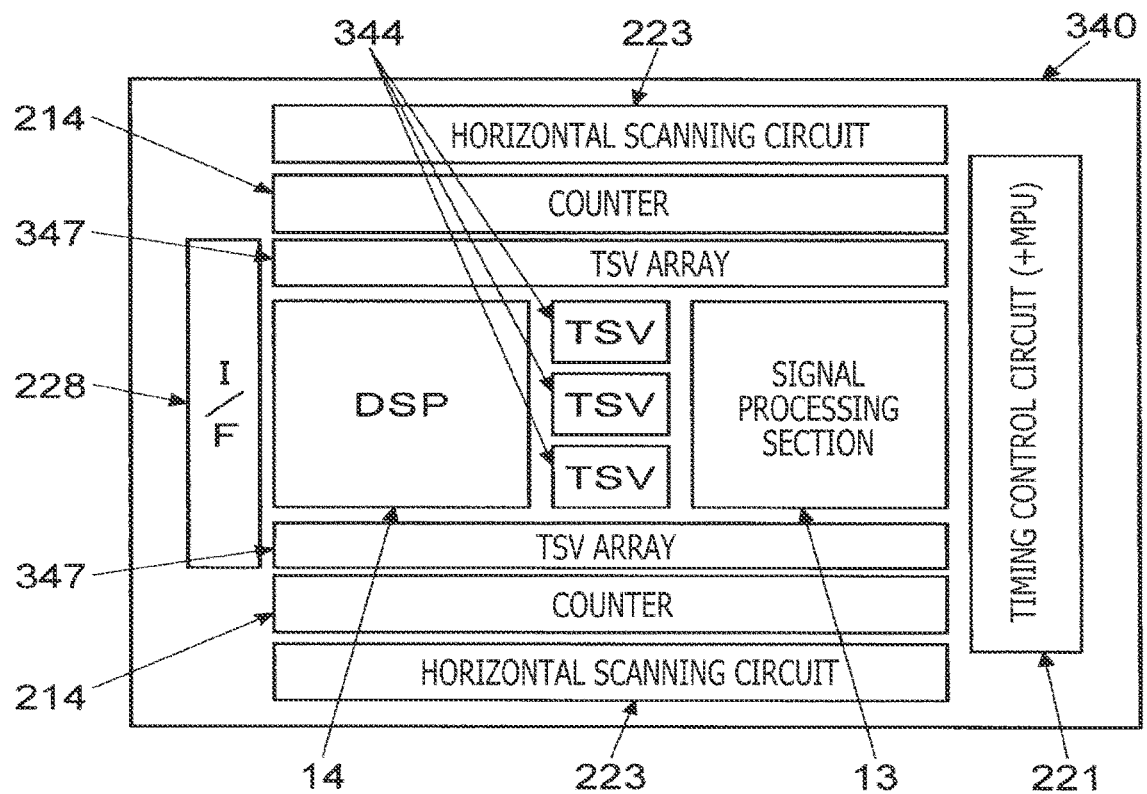
FIG. 25 is a diagram depicting a floor map example of a third substrate according to the fourth floor map example of the third embodiment.

A fourth floor map example will next be described in detail with reference to the drawings. FIG. 24 is diagram depicting a floor map example of the second substrate according to the fourth floor map example. FIG. 25 is diagram depicting a floor map example of the third substrate according to the fourth floor map example. It is to be noted that the floor map example of the first substrate 300 is not described herein in detail since the floor map example of the first substrate 300 may be similar to the floor map example described with reference to FIG. 17 in the first floor map example.

As depicted in FIGS. 24 and 25, in the fourth floor map example, the comparator 213 of each ADC 17, the reference voltage supply section 212, the row drive section 220, and the memory 15 are disposed on the second substrate 320, and the counter 214 of each ADC 17, the horizontal scanning circuit 223, the timing control circuit 221, the signal processing section 13, the DSP 14, and various I/Fs 228 (including the I/Fs 225, 226, and 227) are disposed on the third substrate 340. Further, TSV arrays 327 and TSVs 324 passing through the second substrate and electrically connected to the third substrate 340 are provided on the second substrate 320, and TSV arrays 347 electrically connected to the TSV arrays 327 on the second substrate 320 are provided on the third substrate 340. It is to be noted that the timing control circuit 221 may include the MPU. Moreover, an OTP (One Time Programmable Read Only Memory) 326 that stores various types of programs and data (including the program for the learned model and the like) may be disposed on the second substrate 320.

Each comparator 213 on the second substrate 320 is connected to the pixel array section 101 on the first substrate 300 via the TSV arrays 325 and 305. Further, the comparator 213 is connected to the counter 214 on the third substrate 340 via the TSV arrays 327 and 347. The signal processing section 13 and the DSP 14 on the third substrate 340 are connected to the memory 15 on the second substrate 320 via the TSVs 324 and 344.

In such a stacked structure, the electromagnetic shield 141 is disposed, for example, between the first substrate 300 and the second substrate 320 or between the second substrate 320 and the third substrate 340. The electromagnetic shield 141 is provided in the region where the electromagnetic shield 141 covers at least the entire DSP 14, such as the entire region between the first substrate 300 and the second substrate 320 or the entire region between the second substrate 320 and the third substrate 340. By providing the electromagnetic shield 141 that covers the DSP 14 in this way, it is possible to reduce the penetration of the noise generated by executing the signal processing by the DSP 14 into the pixel array section 101.

3.3 Advantages and Effects

As described so far, according to the present embodiment, more finely classifying the analog circuit 201 and the logic circuit 202 configuring the image sensor 10 makes it possible to optimally classify the analog circuit 201 and the logic circuit 202 to the respective layers. At that time, interposing the electromagnetic shield 141 in at least part of the region between the DSP 14 and the pixel array section 101 makes it possible to reduce the penetration of the noise resulting from the signal processing by the DSP 14 into the pixel array section 101; thus, even in the case in which the DSP 14 is actuated as the processing section that executes the computing processing based on the learned model, it is possible to acquire an image with the reduced degradation in quality.

Other configurations, operations, and effects are not described herein in detail since the other configurations, operations, and effects may be similar to those in the preceding embodiments.

4. Fourth Embodiment

A fourth embodiment will next be described in detail with reference to the drawings. In the present embodiment, supply of electricity to respective layers, that is, the first layer configured by the first substrate 100/300 to the third layer configured by the third substrate 140 (147, 148)/340, will be described. It is to be noted that constituent elements similar to those in the preceding embodiments are denoted by the same reference signs and that repetitive description is omitted in the following description. Further, an imaging apparatus that serves as an electronic apparatus according to the fourth embodiment may be similar to, for example, the imaging apparatus 1 described with reference to FIG. 1 in the preceding embodiment; thus, detailed description of the imaging apparatus is omitted herein.

4.1 First Example

Figure 26:
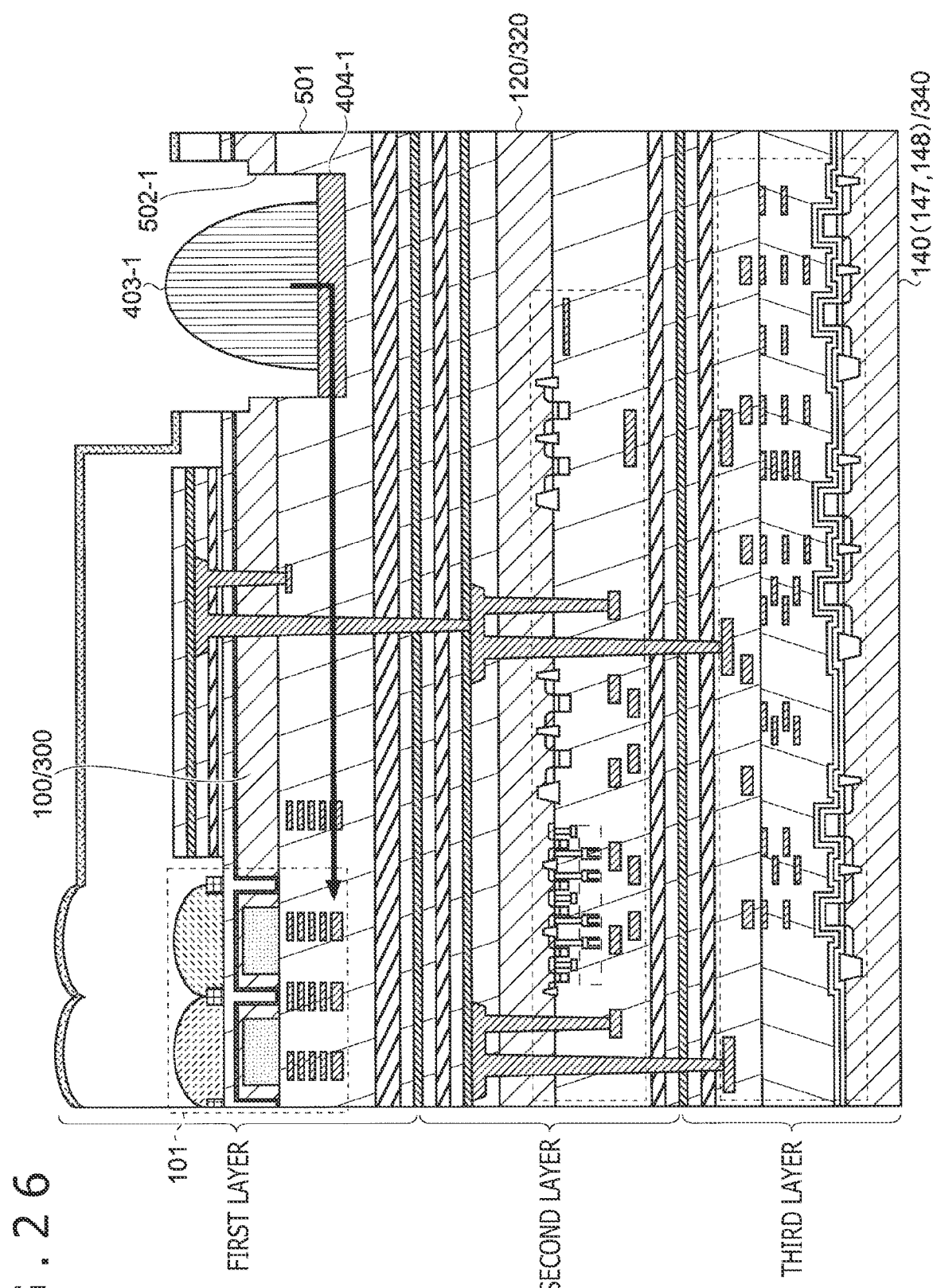
FIG. 26 is an explanatory cross-sectional view of a configuration for supply of electricity to a first layer according to a first example of a fourth embodiment.
Figure 27:
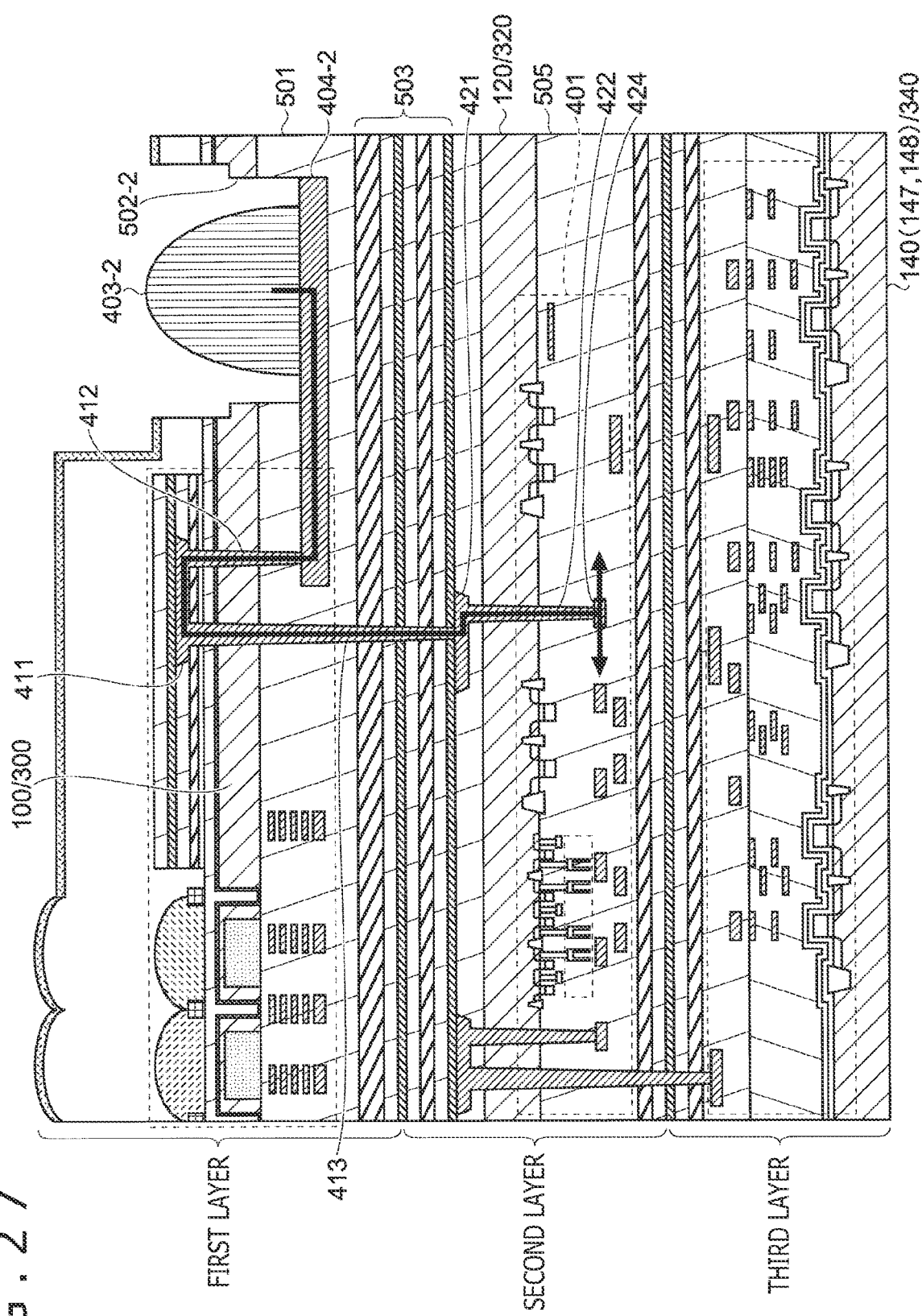
FIG. 27 is an explanatory cross-sectional view of a configuration for supply of electricity to a second layer according to the first example of the fourth embodiment.
Figure 28:
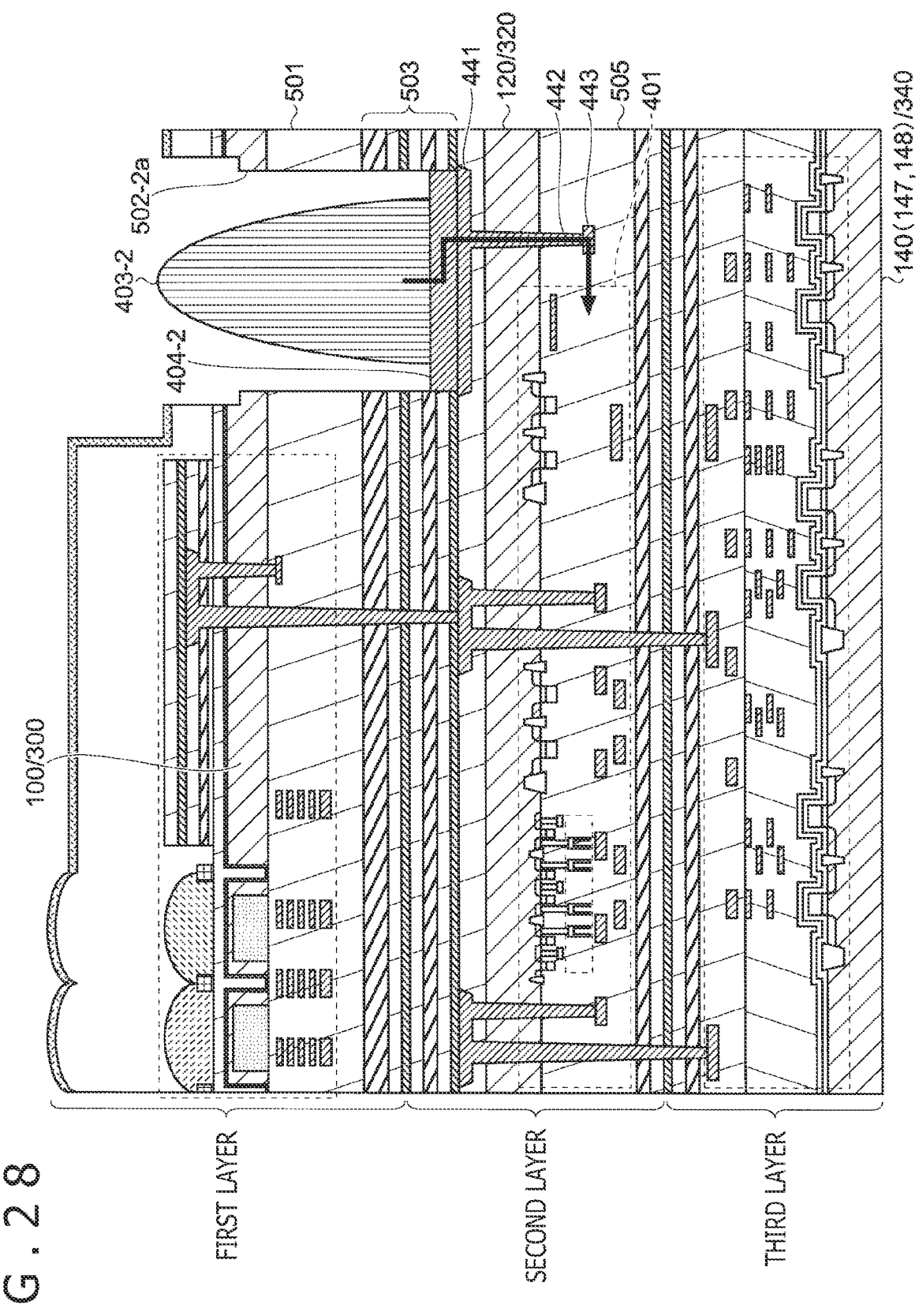
FIG. 28 is an explanatory cross-sectional view of a configuration for supply of electricity to a second layer according to a modification of the first example of the fourth embodiment.

FIGS. 26 to 28 are explanatory cross-sectional views of supply of electricity to each layer according to a first example of the present embodiment. It is to be noted that a case in which the image sensor 10 is a back-illuminated image sensor is exemplarily described in the first example.

4.1.1 Supply of Electricity to First Layer

FIG. 26 is an explanatory cross-sectional view of a configuration for supply of electricity to the first layer. As depicted in FIG. 26, a power supply pin 403-1 (pad included in the pad array 103/303 described above) that supplies electricity to the first layer is provided, for example, in a trench 502-1 that is formed in a range of a rear surface (upper surface in FIG. 26) of the first substrate 100/300 to approximately halfway along an interconnection layer 501 on the first layer. An electrode pad 404-1 formed in the interconnection layer 501 is exposed to a bottom portion of the trench 502-1.

Therefore, the power supply pin 403-1 formed in the trench 502-1 is electrically connected to the power supply pad 404-1 by coming in contact with the power supply pad 404-1.

The power supply pad 404-1 may be a laminated film in which, for example, tantalum (Ta), an aluminum (Al)-copper (Cu) alloy, tantalum (Ta), tantalum nitride (TaN), tantalum (Ta), and tantalum nitride (TaN) are laminated from above. On the other hand, it is possible to use, for example, lead (Pb), copper (Cu), gold (Au), or the like for the power supply pin 403-1.

The electrode pad 404-1 is connected to circuit elements such as the pixel array section 101 disposed on the first layer via an interconnection that is provided in the interconnection layer 501 and that is not depicted. Further, the power supply pin 403-1 is connected to a power supply, not depicted, for the circuit elements provided on the first layer. The electricity supplied to the power supply pin 403-1 is, therefore, supplied to the circuit elements such as the pixel array section 101 disposed on the first layer via the power supply pad 404-1 and the interconnection within the interconnection layer 501.

4.1.2 Supply of Electricity to Second Layer

FIG. 27 is an explanatory cross-sectional view of a configuration for supply of electricity to the second layer. As depicted in FIG. 27, a power supply pin 403-2 (pad included in the pad array 103/303 described above) that supplies electricity to the second layer is provided, similarly to the power supply pin 403-1 that supplies electricity to the first layer, in a trench 502-2 that is formed in a range of the rear surface (upper surface in FIG. 27) of the first substrate 100/300 to approximately halfway along the interconnection layer 501 on the first layer, for example. An electrode pad 404-2 formed in the interconnection layer 501 is exposed to a bottom portion of the trench 502-2. Therefore, the power supply pin 403-2 formed in the trench 502-2 is electrically connected to the power supply pad 404-2 by coming in contact with the power supply pad 404-2.

Similarly to the power supply pad 404-1, the power supply pad 404-2 may be a laminated film in which, for example, tantalum (Ta), an aluminum (Al)-copper (Cu) alloy, tantalum (Ta), tantalum nitride (TaN), tantalum (Ta), and tantalum nitride (TaN) are laminated from above. Further, it is also possible to use the same material as that included in the power supply pin 403-1, such as lead (Pb), copper (Cu), or gold (Au), for the power supply pin 403-2.

From the first substrate 100/300 to the second substrate 120/320, a power supply line that guides the electricity supplied via the power supply pin 403-2 to the second substrate 120/320 is formed. This power supply line possibly includes, for example, a twin TSV that is obtained by connecting a TSV 412 passing through the first substrate 100/300 to a TSV 413 passing through a range of the first substrate 100/300 to an interlayer insulating film 503 provided between the first layer and the second layer, by an interconnection 411 formed on the rear surface of the first substrate 100/300. Also, the power supply line possibly includes a TSV 422 that passes through the second substrate 120/320 and that guides the electricity supplied to the rear surface of the second substrate 120/320 via the twin TSV to a front surface (element formation surface side) of the second substrate 120/320.

The TSV 413 formed in a range of the first layer to the second layer is connected to the TSV 422 passing through the second substrate 120/320 via an interconnection 421 formed on the rear surface of the second substrate 120/320. Further, the TSV 422 is connected to an interconnection 424 formed on an interconnection layer 505 on the second layer. The interconnection 424 is electrically connected to a circuit element 401 provided on the second layer. The electricity supplied from a power supply, not depicted, for the circuit element 401 to the power supply pin 403-2 is, therefore, supplied to the circuit element 401 on the second layer via the power supply pad 404-2, the TSV 412, the interconnection 411, the TSV 413, the interconnection 421, the TSV 422, and the interconnection 424. It is to be noted that the circuit element 401 possibly includes the analog circuit, the logic circuit, and the like disposed on the second substrate 120/320 in the preceding embodiments.

4.1.2.1 Modification of Supply of Electricity to Second Layer

FIG. 28 is an explanatory cross-sectional view of a modification of the configuration for supply of electricity to the second layer. In an example depicted in FIG. 27 described above, the case of guiding the electricity supplied to the power supply pin 403-2 to the rear surface of the first substrate 100/300 by the TSV 412 and then guiding the electricity to the second layer via the two TSVs 413 and 422 is exemplarily described. In the present modification, by contrast, a case of supplying the electricity supplied to the power supply pin 403-2 directly to the second layer is exemplarily described.

As depicted in FIG. 28, in the present modification, a trench 502-2a used for forming the power supply pin 403-2 extends up to the interlayer insulating film 503 provided between the first layer and the second layer. The power supply pad 404-2 in contact with the power supply pin 403-2 is formed on a bottom portion of the trench 502-2a.

The power supply pad 404-2 is connected to an interconnection 441 formed on the rear surface of the second substrate 120/320. The interconnection 441 is connected to a TSV 442 that passes through the second substrate 120/320 to come in contact with an interconnection 443 formed in the interconnection layer 505 on the second layer. The interconnection 443 is electrically connected to the circuit element 401 provided on the second layer. The electricity supplied from the power supply, not depicted, for the circuit element 401 to the power supply pin 403-2 is, therefore, supplied to the circuit element 401 on the second layer via the power supply pad 404-2, the interconnection 441, the TSV 442, and the interconnection 443.

4.1.3 Supply of Electricity to Third Layer

Figure 29:
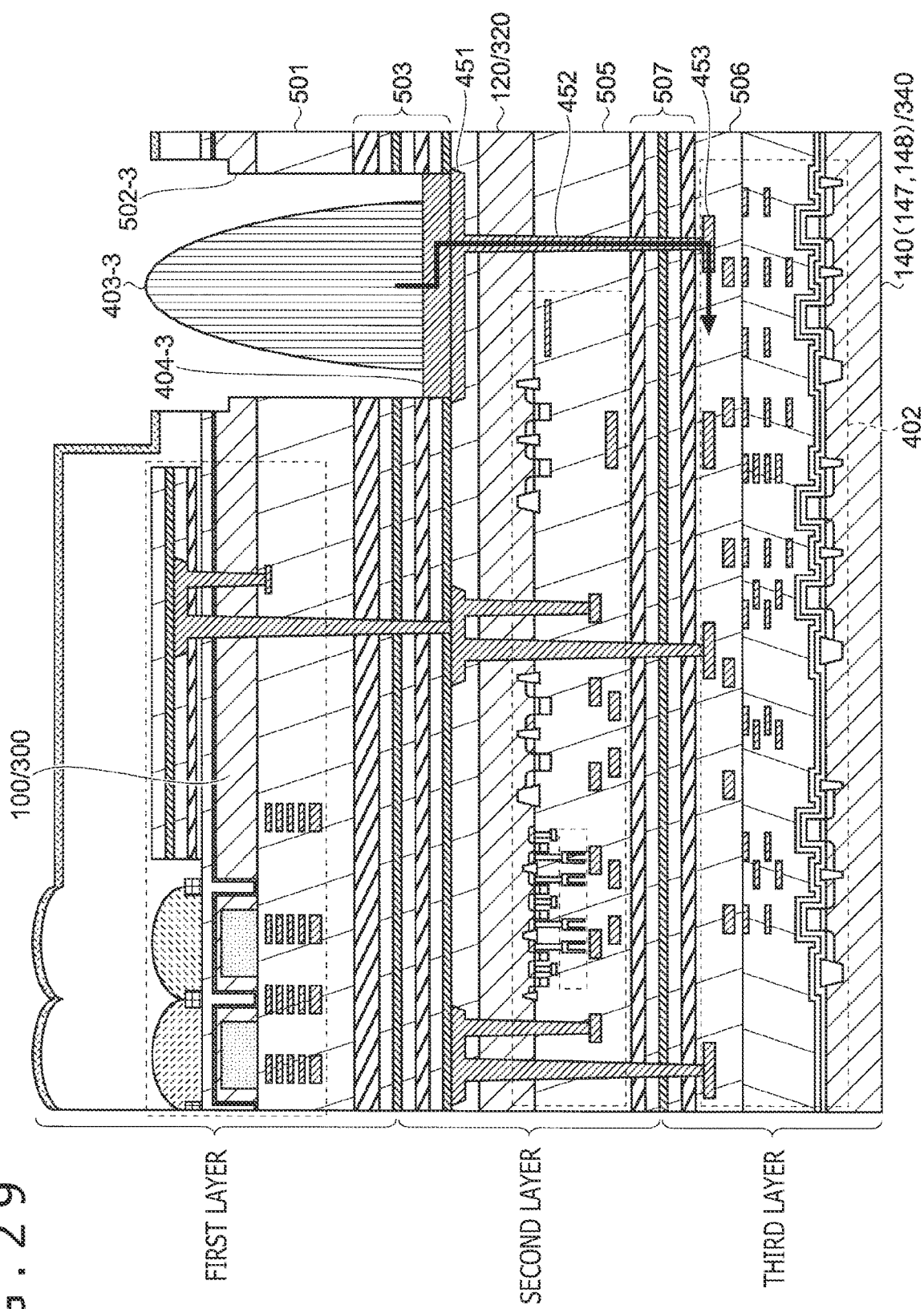
FIG. 29 is an explanatory cross-sectional view of a configuration for supply of electricity to a third layer according to the first example of the fourth embodiment.

FIG. 29 is an explanatory cross-sectional view of a configuration for supply of electricity to the third layer. As depicted in FIG. 29, in the configuration for supply of the electricity to the third layer, a power supply pin 403-3 (pad included in the pad array 103/303 described above) and a power supply pad 404-3 are provided, for example, in a trench 502-3 passing through a range of the rear surface (upper surface in FIG. 29) of the first substrate 100/300 to the interlayer insulating film 503 provided between the first layer and the second layer, similarly to the configuration described with reference to FIG. 28 as described above.

The power supply pad 404-3 comes in contact with an interconnection 451 formed on the rear surface of the second substrate 120/320. The interconnection 451 is connected to a TSV 452 that passes through a range of the second substrate 120/320 to an interlayer insulating film 507 provided between the second layer and the third layer and that comes in contact with an interconnection 453 formed in an interconnection layer 506 on the third layer. The interconnection 453 is electrically connected to a circuit element 402 provided on the third layer. The electricity supplied from a power supply, not depicted, for the circuit element 402 to the power supply pin 403-3 is, therefore, supplied to the circuit element 402 on the third layer via the power supply pad 404-3, the interconnection 451, the TSV 452, and the interconnection 453. It is to be noted that the circuit element 402 possibly includes the analog circuit, the logic circuit, and the like disposed on the third substrate 140 (147, 148)/340 in the preceding embodiments.

4.1.3.1 Modification of Supply of Electricity to Third Layer

Figure 30:
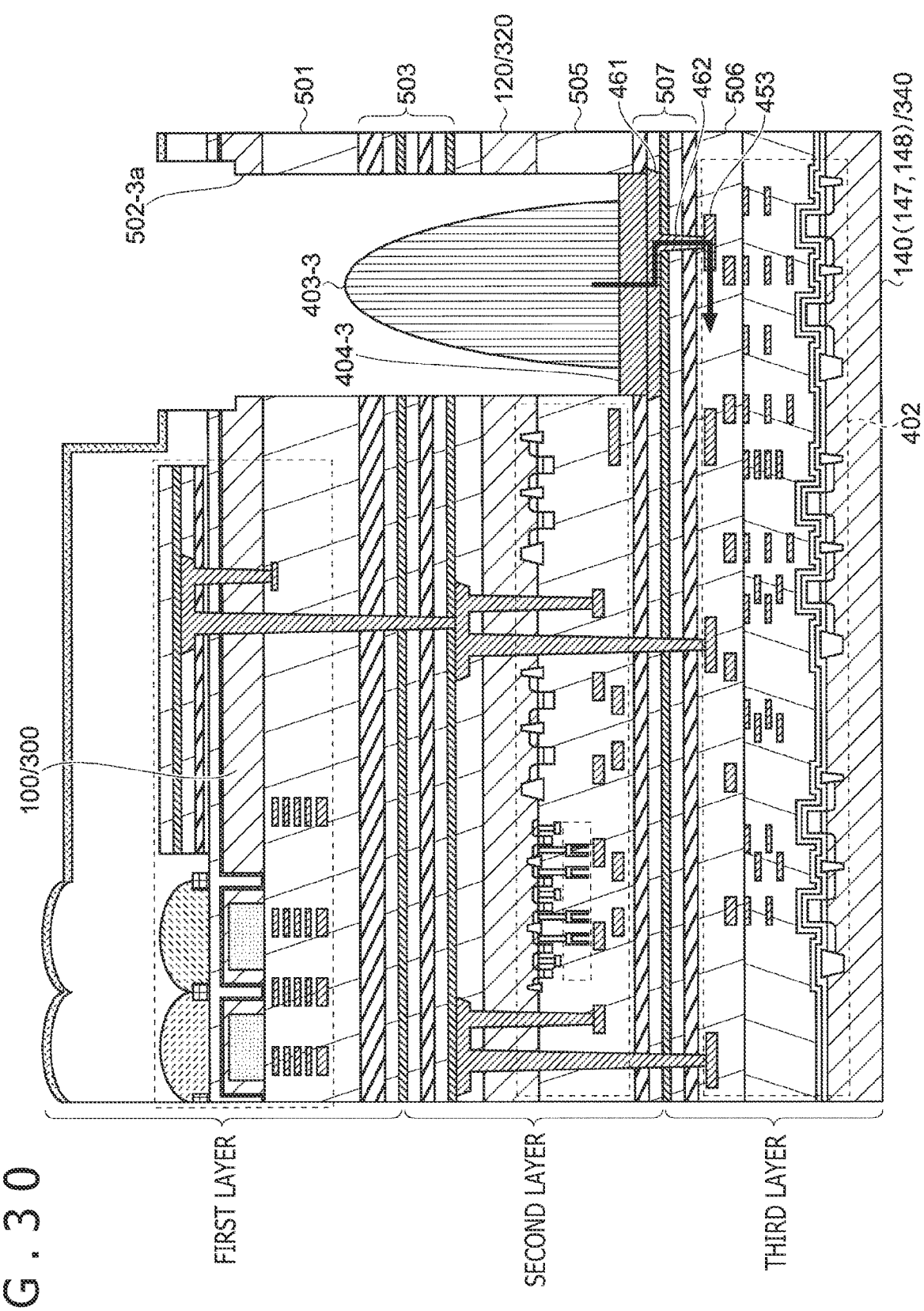
FIG. 30 is an explanatory cross-sectional view of a configuration for supply of electricity to a third layer according to a modification of the first example of the fourth embodiment.

FIG. 30 is an explanatory cross-sectional view of a modification of the configuration for supply of electricity to the third layer. In an example depicted in FIG. 29 described above, the case of forming the power supply pin 403-3 and the electrode pad 404-3 in the trench 502-3 passing through the range of the rear surface of the first substrate 100/300 to the interlayer insulating film 503 provided between the first layer and the second layer is exemplarily described. In the present modification, by contrast, a case of forming a power supply pin 403-3 and an electrode pad 404-3 in a trench 502-3*a* ranging from the rear surface of the first substrate 100/300 to the interlayer insulating film 503 provided between the second layer and the third layer is exemplarily described.

As depicted in FIG. 30, the power supply pad 404-3 that is formed in the trench 502-3*a* ranging from the rear surface of the first substrate 100/300 to the interlayer insulating film 503 provided between the second layer and the third layer comes in contact with an interconnection 461 exposed to a bottom surface of the trench 502-3*a*. The interconnection 461 is connected to a TSV 462 that passes through the interlayer insulating film 507 provided between the second layer and the third layer and that comes in contact with the interconnection 453 formed in the interconnection layer 506 on the third layer. The interconnection 453 is electrically connected to the circuit element 402 provided on the third layer. The electricity supplied from the power supply, not depicted, for the circuit element 402 to the power supply pin 403-3 is, therefore, supplied to the circuit element 402 on the third layer via the power supply pad 404-3, the interconnection 461, the TSV 462, and the interconnection 453.

4.2 Second Example 4.2.1 Supply of Electricity to First and Second Layers

Figure 31:
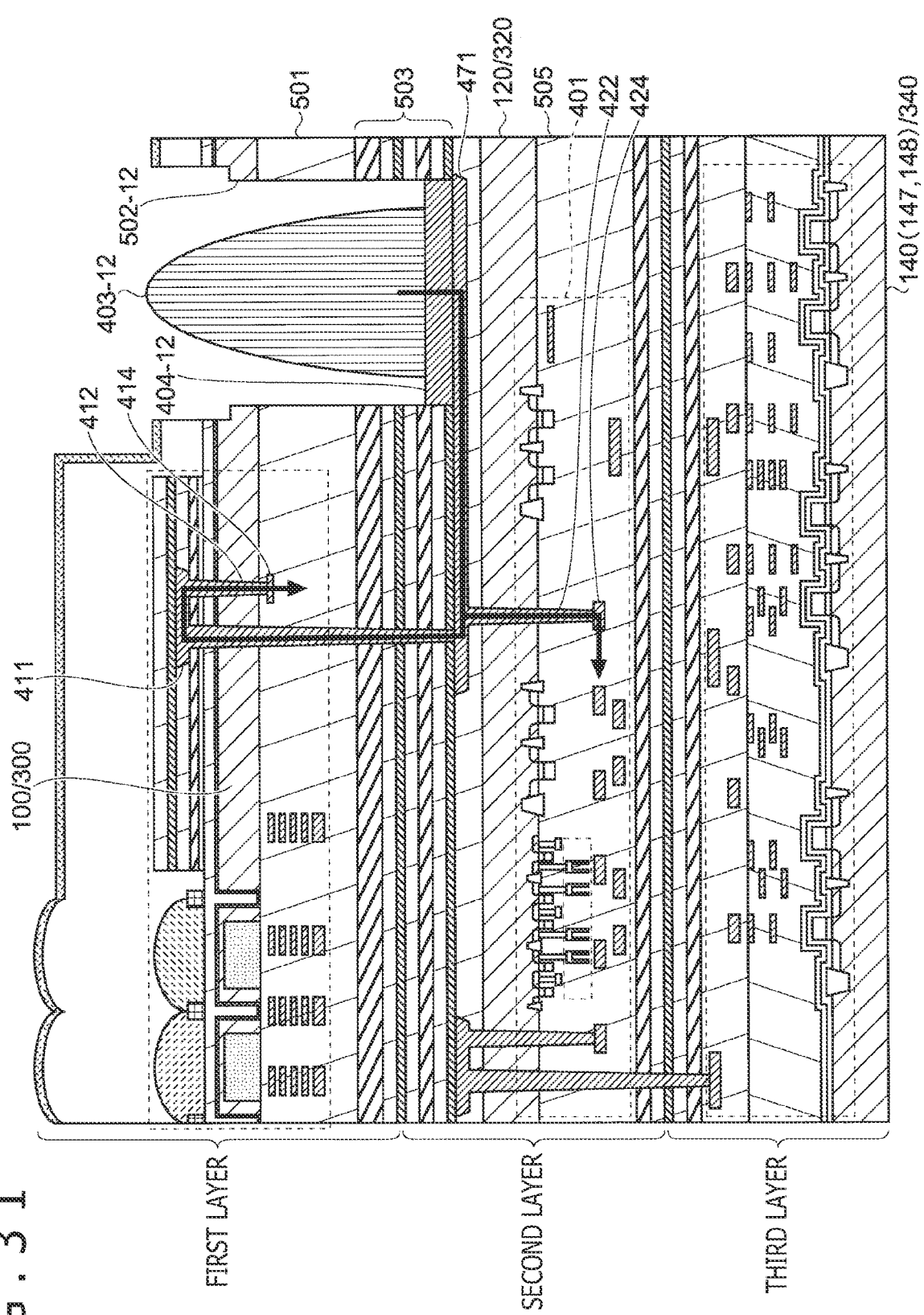
FIG. 31 is an explanatory cross-sectional view of a configuration for supply of electricity to first and second layers according to a second example of the fourth embodiment.

FIG. 31 is an explanatory cross-sectional view of supply of electricity to the first layer and the second layer according to a second example of the present embodiment. It is to be noted that the case in which the image sensor 10 is the back-illuminated image sensor is exemplarily described in the second example. Further, in the second example, the supply of electricity to the third layer is not described herein in detail since the supply of electricity to the third layer may have a similar configuration to the configuration described with reference to FIG. 29 in the first example.

As depicted in FIG. 31, in the configuration for supply of the electricity to the first layer and the second layer according to the second example, a power supply pin 403-12 and a power supply pad 404-12 are provided, for example, in a trench 502-12 passing through a range of the rear surface (upper surface in FIG. 31) of the first substrate 100/300 to the interlayer insulating film 503 provided between the first layer and the second layer, similarly to the configuration described with reference to FIG. 28 as described above.

The power supply pad 404-12 comes in contact with an interconnection 471 formed on the rear surface of the second substrate 120/320. The interconnection 471 is individually connected to the TSV 413 described with reference to FIG. 26 in the first example and the TSV 422 described with reference to FIG. 27 in the same first example. The electricity supplied from the power supply, not depicted, for the circuit element such as the pixel array section 101 disposed on the first layer and for the circuit element 402 disposed on the second layer to the power supply pin 403-12 is, therefore, supplied to the circuit element such as the pixel array section 101 via the power supply pad 404-12, the interconnection 471, the TSV 413, the interconnection 411, the TSV 412, and an interconnection 414 formed in the interconnection layer 501 on the first layer, and supplied to the circuit element 401 on the second layer via the power supply pad 404-12, the interconnection 471, the TSV 422, and the interconnection 424.

4.3 Advantages and Effects

According to the configuration described so far, it is possible to supply the electricity to each of the first to third layers from the power supply independent according to the circuit element to which the electricity is supplied. It is thereby possible to supply the electricity to each circuit element more stably. Other configurations, operations, and effects are not described herein in detail since the other configurations, operations, and effects may be similar to those in the preceding embodiments.

5. Application to Other Sensors

It is to be noted that, while the cases of applying the technology according to the present disclosure to the solid-state imaging device (image sensor 10) that acquires a two-dimensional image have been exemplarily described, the application of the technology according to the present disclosure is not limited to the solid-state imaging device. The technology according to the present disclosure can be applied to various light receiving sensors including, for example, a ToF (Time of Flight) sensor, an infrared (IR) sensor, and a DVS (Dynamic Vision Sensor). In other words, configuring a chip structure of the light receiving sensor as a stacked structure makes it possible to achieve a reduction in the noise contained in a sensor result, miniaturization of the sensor chip, and the like.

6. Example of Application to Mobile Body

The technology according to the present disclosure (present technology) is applicable to various products. For example, the technology according to the present disclosure may be realized as an apparatus mounted in a mobile body of any of types including a vehicle, an electric vehicle, a hybrid electric vehicle, a motorcycle, a bicycle, a personal mobility, an airplane, a drone, a ship, and a robot.

Figure 32:
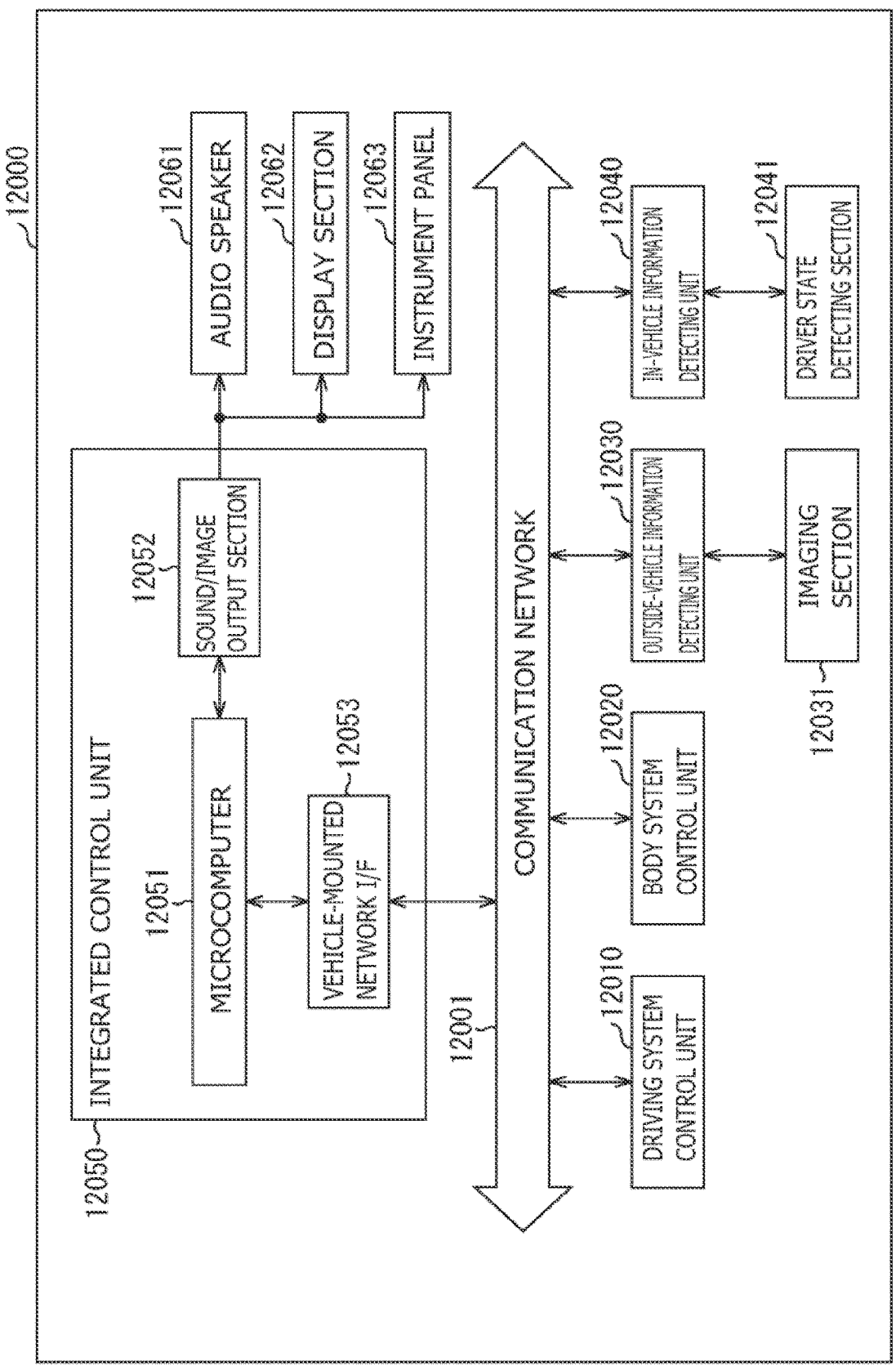
FIG. 32 is a block diagram depicting an example of schematic configuration of a vehicle control system.

FIG. 32 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 32, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 32, an audio speaker 12061, a display section 12062, and an instrument panel 12063 are illustrated as the output device. The display section 12062 may, for example, include at least one of an on-board display and a head-up display.

Figure 33:
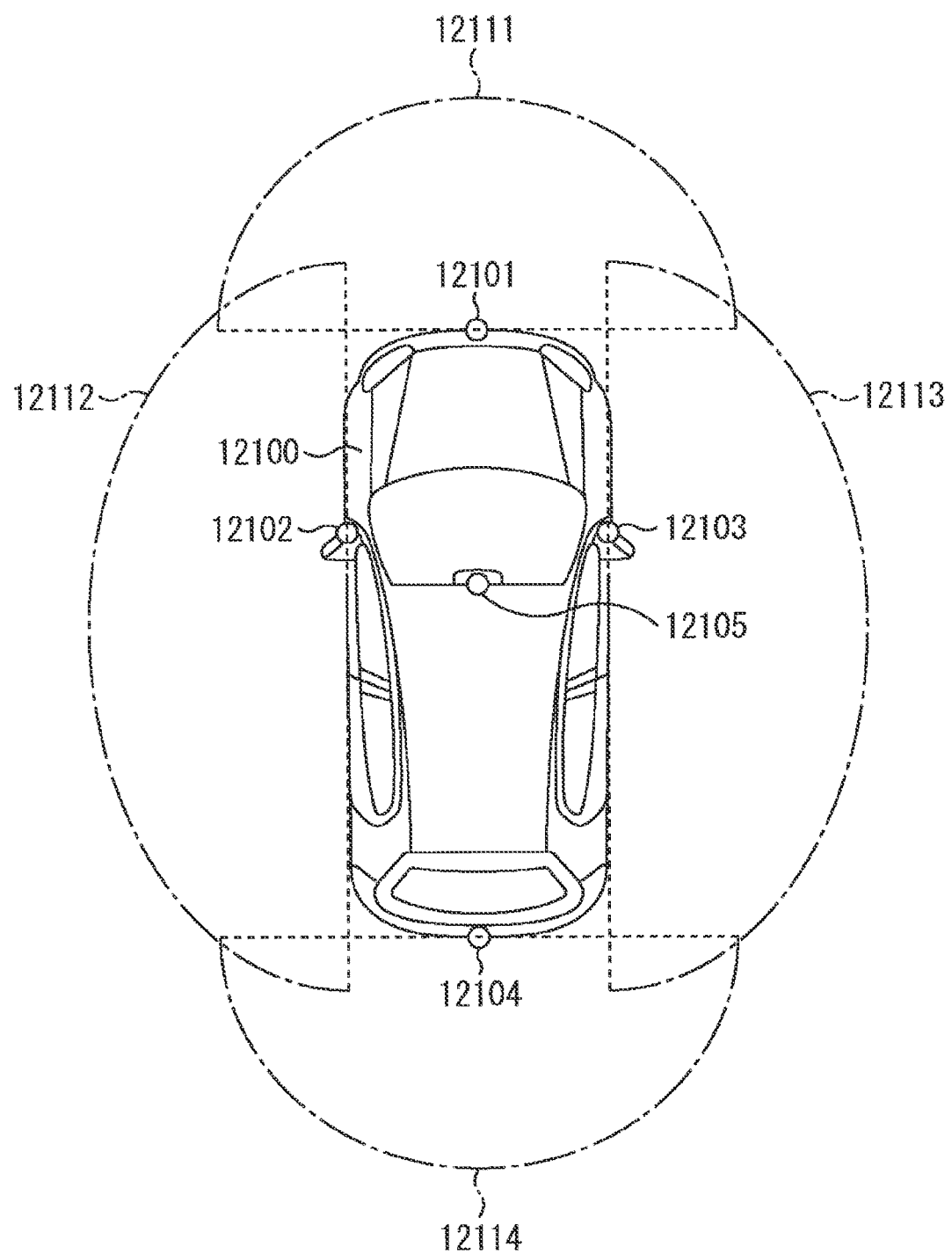
FIG. 33 is a diagram of assistance in explaining an example of installation positions of an outside-vehicle information detecting section and an imaging section.

FIG. 33 is a diagram depicting an example of the installation position of the imaging section 12031.

In FIG. 33, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 33 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure is applicable has been described so far. The technology according to the present disclosure is applicable to the imaging section 12031 or the like. By applying the technology according to the present disclosure to the imaging section 12031 or the like, it is possible to miniaturize the imaging section 12031 or the like, thereby facilitating design of the interior and exterior of the vehicle 12100. Further, by applying the technology according to the present disclosure to the imaging section 12031 or the like, it is possible to acquire a clear image with reduced noise; thus, it is possible to provide a driver with a captured image that is easier to view. It is thereby possible to mitigate the fatigue of the driver.

7. Example of Application to Endoscopic Surgery System

The technology according to the present disclosure (present technology) is applicable to various products. The technology according to the present disclosure may be applied to, for example, an endoscopic surgery system.

Figure 34:
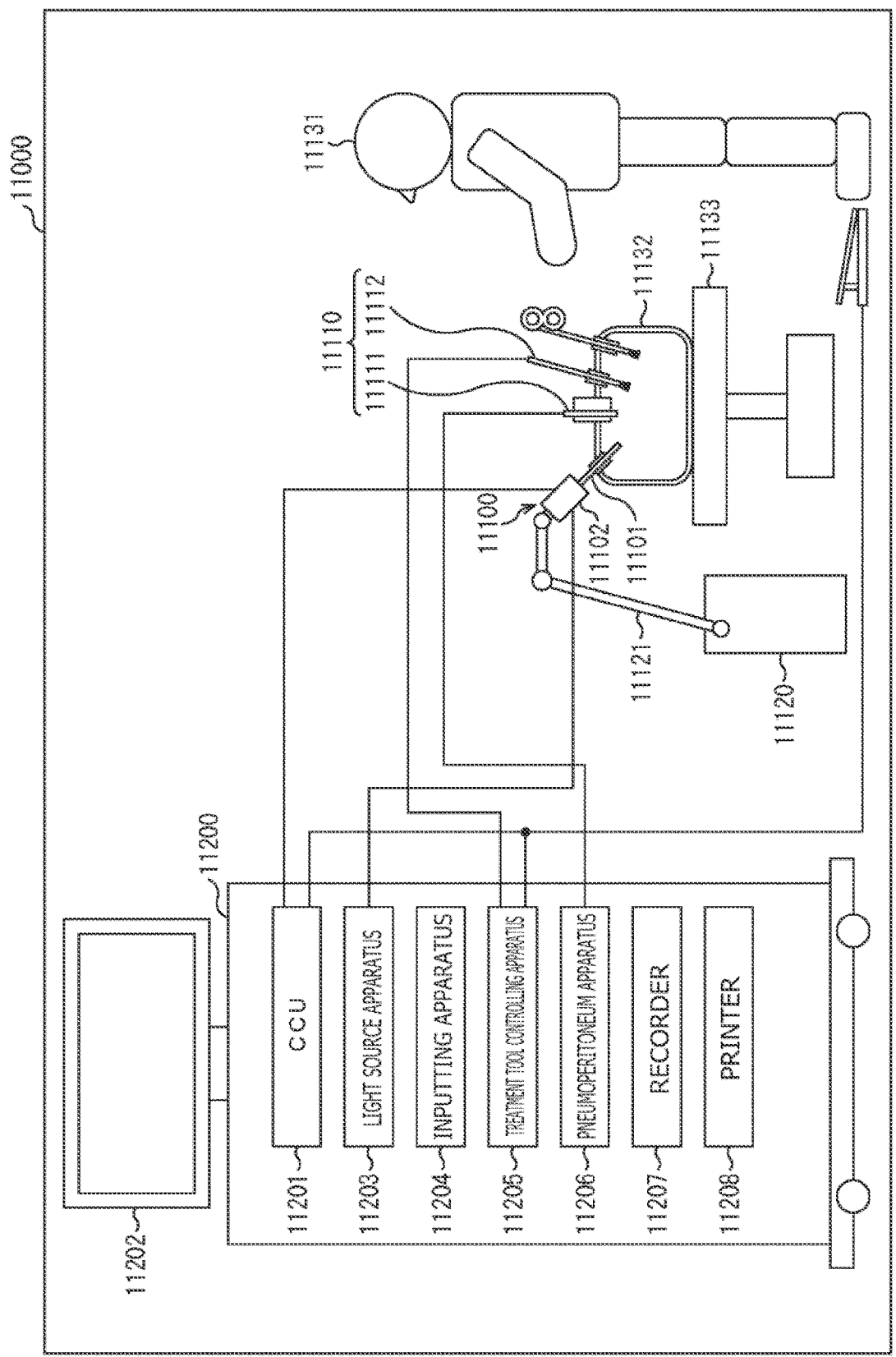
FIG. 34 is a view depicting an example of a schematic configuration of an endoscopic surgery system.

FIG. 34 is a view depicting an example of a schematic configuration of an endoscopic surgery system to which the technology according to an embodiment of the present disclosure (present technology) can be applied.

In FIG. 34, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 35:
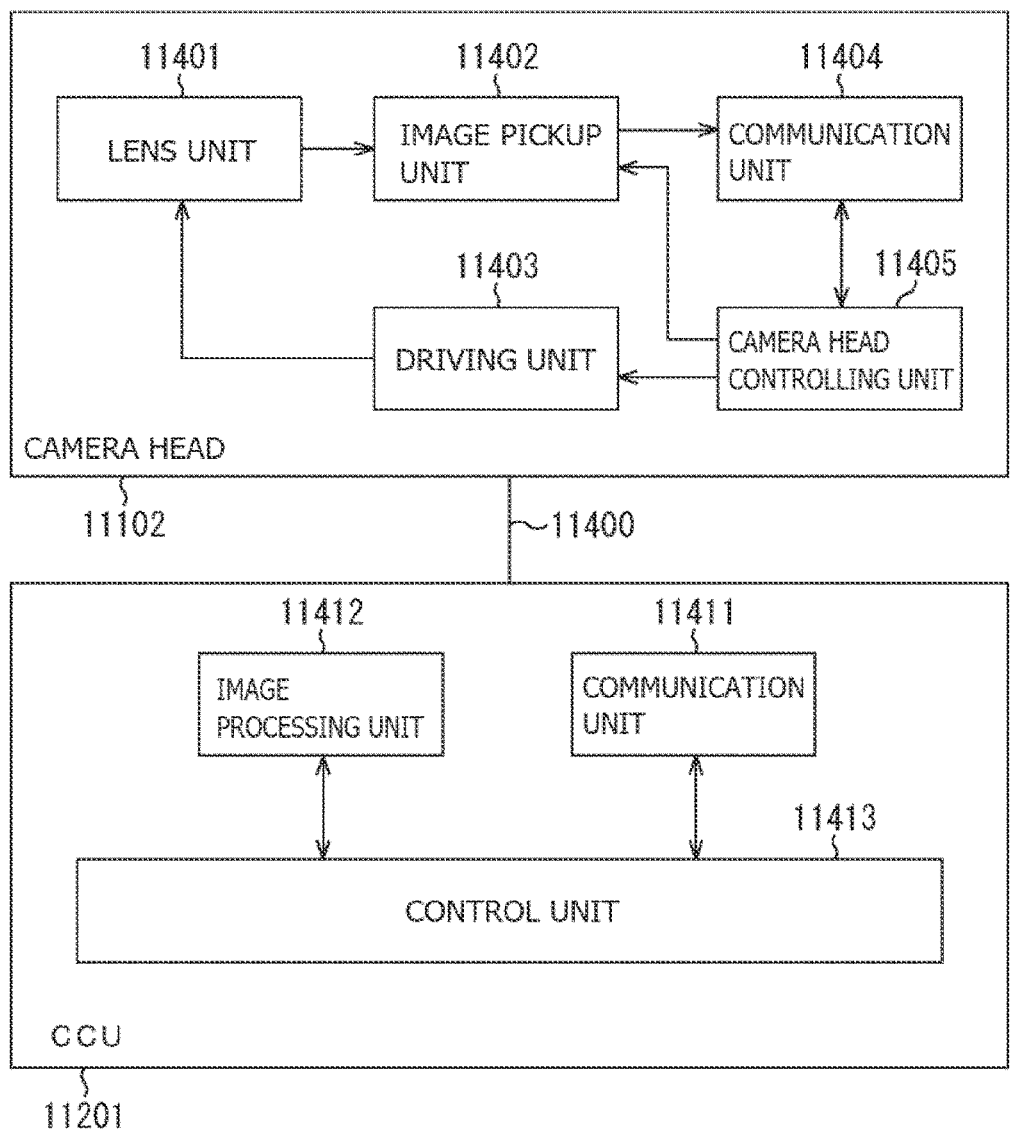
FIG. 35 is a block diagram depicting an example of a functional configuration of a camera head and a camera control unit (CCU).

FIG. 35 is a block diagram depicting an example of a functional configuration of the camera head 11102 and the CCU 11201 depicted in FIG. 34.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure is applicable has been described so far. The technology according to the present disclosure is applicable to, for example, the image pickup unit 11402 of the camera head 11102 or the like in the abovementioned configuration. By applying the technology according to the present disclosure to the camera head 11102, it is possible to miniaturize the camera head 11102 or the like; thus, it is possible to make the endoscopic surgery system 11000 compact. Further, by applying the technology according to the present disclosure to the camera head 11102 or the like, it is possible to acquire a clear image with reduced noise; thus, it is possible to provide the surgeon with a captured image that is easier to view. It is thereby possible to mitigate the fatigue of the surgeon.

It is to be noted that, while the endoscopic surgery system has been described herein by way of example, the technology according to the present disclosure may be applied to another system such as a microscopic surgery system.

8. Example of Application to WSI (Whole Slide Imaging) System

The technology according to the present disclosure can be applied to various products. For example, the technology according to the present disclosure may be applied to a pathological diagnosis system for observing cells or tissues collected from a patient by a medical doctor or the like and then diagnosing a lesion, a support system for the pathological diagnosis system, and the like (hereinafter, referred to as a "diagnosis support system"). This diagnosis support system may be a WSI (Whole Slide Imaging) system for diagnosing a lesion or supporting the diagnosis on the basis of an image acquired utilizing a digital pathology technology.

Figure 36:
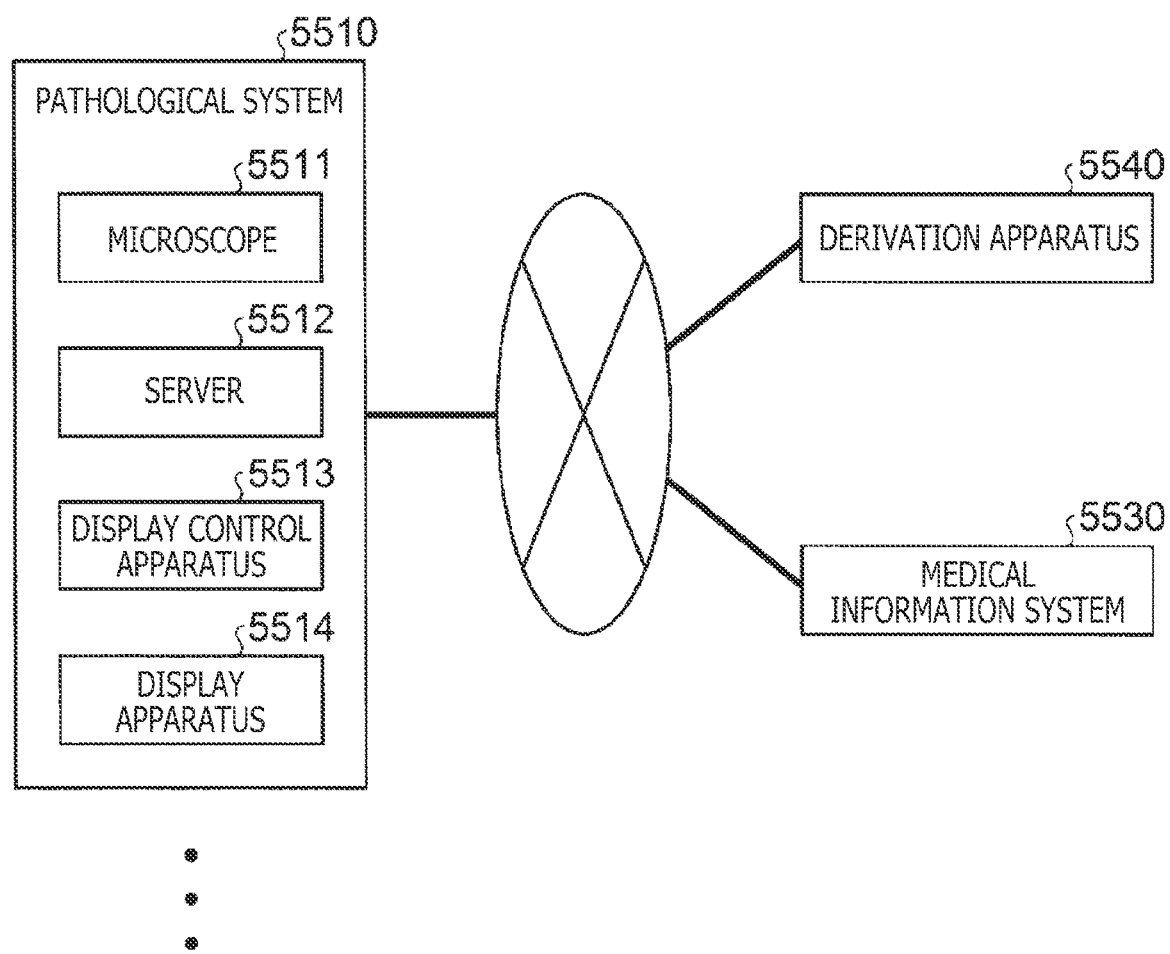
FIG. 36 is a block diagram depicting an example of a schematic configuration of a diagnosis support system.

FIG. 36 is a diagram depicting an example of a schematic configuration of a diagnosis support system 5500 to which the technology according to the present disclosure is applied. As depicted in FIG. 36, the diagnosis support system 5500 includes one or more pathological systems 5510. The diagnosis support system 5500 may further include a medical information system 5530 and a derivation apparatus 5540.

The one or more pathological systems 5510 are each a system mainly used by a pathologist and introduced into, for example, a research laboratory or a hospital. The respective pathological systems 5510 may be introduced into different hospitals, and are connected to the medical information system 5530 and the derivation apparatus 5540 via various types of network such as a WAN (Wide Area Network) (including the Internet), a LAN (Local Area Network), a public line network, or a mobile communication network.

Each pathological system 5510 includes a microscope 5511, a server 5512, a display control apparatus 5513, and a display apparatus 5514.

The microscope 5511 has a function as an optical microscope, images an object to be observed that is contained in a glass slide, and acquires a pathological image that is a digital image. The object to be observed is, for example, tissues or cells collected from a patient and may be a piece of organ meat, saliva, a blood, or the like.

The server 5512 stores and saves the pathological image acquired by the microscope 5511 in a storage section that is not depicted. In addition, in a case of receiving a viewing request from the display control apparatus 5513, the server 5512 searches a pathological image in the storage section that is not depicted and transmits the searched pathological image to the display control apparatus 5513.

The display control apparatus 5513 transmits the viewing request of the pathological image received from a user to the server 5512. The display control apparatus 5513 then controls the pathological image received from the server 5512 to be displayed on the display apparatus 5514 using a liquid crystal, EL (Electro-Luminescence), a CRT (Cathode Ray Tube), or the like. It is to be noted that the display apparatus 5514 may be 4K-enabled or 8K-enabled, and the number of the display apparatuses 5514 is not limited to one but may be two or more.

It is noted herein that, in a case in which the object to be observed is a solid material such as a piece of organ meat, this object to be observed may be, for example, a stained thin piece. The thin piece may be produced by, for example, slicing a piece of block cut from a sample such as an organ. Further, at a time of slicing, the piece of block may be fixed by paraffin or the like.

To stain the thin piece, various types of staining including ordinary staining such as HE (Hematoxylin-Eosin) staining for indicating a form of a tissue and immunostaining such as IHC (Immunohistochemistry) staining for indicating an immune state of the tissue may be applied. At that time, one thin piece may be stained by using a plurality of different reagents, or two or more thin pieces continuously cut from the same piece of block (also referred to as "adjacent thin pieces") may be stained by using different reagents.

The microscope 5511 possibly includes a low resolution imaging section for low resolution imaging, and a high resolution imaging section for high resolution imaging. The low resolution imaging section and the high resolution imaging section may be either different optical systems or an identical optical system. In a case of the identical optical system, a resolution of the microscope 5511 may be changed according to an object to be imaged.

The glass slide containing the object to be observed is placed on a stage located within an angle of view of the microscope 5511. First, the microscope 5511 acquires an overall image within the angle of view by using the low resolution imaging section and specifies a region of the object to be observed from the acquired overall image. Subsequently, the microscope 5511 splits the region where the object to be observed is present into a plurality of split regions of a predetermined size and sequentially images the respective split regions by the high resolution imaging section, thereby acquiring high resolution images of the respective split regions. For switchover of an intended split region, the stage may be moved, an imaging optical system may be moved, or both the stage and the imaging optical system may be moved. Further, to prevent occurrence of a region that is not imaged due to unintended slip of the glass slide, the adjacent split regions may overlap each other. Moreover, the overall image may contain identification information to make the overall image correspond to a patient. This identification information may be, for example, a character string or a QR code (registered trademark).

The high resolution images acquired by the microscope 5511 are input to the server 5512. The server 5512 splits each high resolution image into partial images (hereinafter, referred to as a "tile image") at a smaller size. The server 5512 splits one high resolution image into, for example, 10×10 tile images, that is, 100 tile images in total. At that time, in a case of an overlap in the adjacent split regions, the server 5512 may perform stitching processing on the adjacent high resolution images by using a technique such as template matching. In that case, the server 5512 may generate tile images by splitting an entire high resolution image obtained by bonding the images by the stitching processing. It is to be noted, however, that the tile image may be generated from the high resolution image before the stitching processing.

Further, the server 5512 possibly generates tile images at a smaller size by further splitting each tile image. The server 5512 may repeatedly generate such tile images until tile images at a size set as a minimum unit are generated.

Upon generating the tile images in minimum units in this way, the server 5512 executes tile combining processing of generating one tile image by combining a predetermined number of adjacent tile images, on all tile images. This tile combining processing is possibly repeated until one tile image is eventually generated. Through such processing, a tile image group of a pyramid structure in which each layer includes one or more tile images is generated. In this pyramid structure, the tile images of a certain layer are equal in the number of pixels to tile images of a different layer but are different in resolution from the tile images of the different layer. For example, in a case of combining 2×2 tile images, that is, four tile images in total, and then generating one tile image of an upper layer, the resolution of the tile image of the upper layer is a half of that of the tile images of lower layers used in combining.

Constructing the tile image group of such a pyramid structure makes it possible to switch over a level of detail of the object to be observed displayed on the display apparatus, depending on the layer to which the tile images to be displayed belong. In a case of using, for example, the tile images of a lowermost layer, then a narrow region of the object to be observed can be displayed in detail, and a wide region of the object to be observed can be displayed more roughly as the tile images of the upper layer are used.

The generated tile image group of the pyramid structure is stored together with identification information (to be referred to as "tile identification information") that can uniquely identify each tile image, in the storage section that is not depicted. In a case of receiving a request to acquire tile images including the tile identification information from the another apparatus (for example, the display control apparatus 5513 or the derivation apparatus 5540), the server 5512 transmits the tile images corresponding to the tile identification information to the other apparatus.

It is to be noted that the tile images that are the pathological images may be generated per condition of imaging such as a focal length and a condition of staining. In a case of generating the tile images per condition of imaging, a specific pathological image and another pathological image that corresponds to a condition of imaging different from a specific condition of imaging and that is identical in region to the specific pathological image may be displayed side by side. The specific condition of imaging may be designated by a viewer. In addition, in a case in which the viewer designates a plurality of conditions of imaging, pathological images that correspond to the respective conditions of imaging and that are images of the identical region may be displayed side by side.

Further, the server 5512 may store the tile image group of the pyramid structure in another storage apparatus other than the server 5512, such as a cloud server. Moreover, part of or entirety of tile image generation processing described above may be executed by the cloud server or the like.

The display control apparatus 5513 extracts a desired tile image from the tile image group of the pyramid structure according to a user's input operation, and outputs this tile image to the display apparatus 5514. By performing such processing, the user can have a feeling of observing the object to be observed while changing an observation magnification. In other words, the display control apparatus 5513 functions as a virtual microscope. A virtual observation magnification herein actually corresponds to the resolution.

It is to be noted that an imaging method of obtaining the high resolution images may be any method. The high resolution images may be acquired by imaging the split regions while repeatedly stopping and moving the stage, or the high resolution images on a strip may be acquired by imaging the split regions while moving the stage at a predetermined speed. Further, processing of generating the tile images from the high resolution images is not an essential configuration, and images at resolutions changing step by step may be generated by changing the resolution of the overall high resolution image obtained by bonding the high resolution images by the stitching processing step by step. Even in this case, it is possible to present the low resolution image of a wide area range to the high resolution images of a narrow area range, to the user step by step.

The medical information system 5530 is what is called an electronic medical chart system, and stores information identifying each patient, disease information regarding the patient, and information associated with diagnosis including test information and image information used in the diagnosis, a diagnosis result, and prescribed drugs. For example, a pathological image obtained by imaging an object to be observed of a certain patient is temporarily stored via the server 5512 and can be then displayed on the display apparatus 5514 under control of the display control apparatus 5513. A pathologist using the pathological system 5510 makes pathologic diagnosis on the basis of the pathological image displayed on the display apparatus 5514. A result of the pathologic diagnosis made by the pathologist is stored in the medical information system 5530.

The derivation apparatus 5540 can execute analysis of the pathological image. A learning model created by machine learning can be used for this analysis. The derivation apparatus 5540 may derive, as a result of the analysis, a classification result in a specific region, an identification result of the tissues, and the like. Further, the derivation apparatus 5540 may derive the identification result such as cell information, the number of cells, positions, and luminance information as well as scoring information and the like regarding those pieces of information. These pieces of information derived by the derivation apparatus 5540 may be displayed, as diagnosis support information, on the display apparatus 5514 of the pathological system 5510.

It is to be noted that the derivation apparatus 5540 may be a server system including one or more servers (including cloud servers) and the like. Further, the derivation apparatus 5540 may be configured in such a manner as to be incorporated into, for example, the display control apparatus 5513 or the server 5512 within the pathological system 5510. In other words, various types of analysis on the pathological image may be executed within the pathological system 5510.

The technology according to the present disclosure is suitably applicable to, for example, the microscope 5511 among the configurations described so far. Specifically, the technology according to the present disclosure can be applied to the low resolution imaging section and/or the high resolution imaging section in the microscope 5511. By applying the technology according to the present disclosure to the low resolution imaging section and/or the high resolution imaging section, it is possible to achieve miniaturization of the low resolution imaging section and/or the high resolution imaging section and eventually miniaturization of the microscope 5511. This can facilitate transport of the microscope 5511; thus, it is possible to facilitate system introduction, system rearrangement, and the like. Further, by applying the technology according to the present disclosure to the low resolution imaging section and/or the high resolution imaging section, it is possible to execute part of or entirety of processing from acquisition of the pathological image to analysis of the pathological image, on-the-fly within the microscope 5511; thus, it is also possible to output more prompt and more accurate diagnosis support information.

It is to be noted that the configurations described above are not limited to the diagnosis support system and are also applicable to all types of biological microscopes including, for example, a confocal microscope, a fluorescence microscope, and a video microscope. The object to be observed may be herein a biological sample such as cultured cells, fertilized eggs, and sperms, a biomaterial such as a cell sheet and a three-dimensional cell tissue, and a living body such as a zebra fish and a mouse. Further, the object to be observed can be observed in a state of being contained in not only the glass slide but also a well plate, a petit dish, or the like.

In addition, a moving image may be generated from still images of the object to be observed that is acquired by using the microscope. For example, a moving image may be generated from still images captured continuously for a predetermined period of time, or an image sequence may be generated from still images captured at predetermined intervals. By generating the moving image from the still images in this way, it is possible to analyze dynamic features of the object to be observed that include, for example, motions such as pulsation, extension, and mitigation of cancer cells, nerve cells, cardiac muscular tissues, sperms, and the like, and fission processes of cultured cells and fertilized eggs using machine learning.

While the embodiments of the present disclosure have been described so far, the technical scope of the present disclosure is not limited to the embodiments described above and can be variously changed without departure of the concept of the present disclosure. Further, the constituent elements in the different embodiments and modifications may be combined as appropriate.

Moreover, the effects of the respective embodiments described in the present specification are given as an example only, the effects of the present disclosure are not limited thereto, and other effects may be exhibited.

Furthermore, each of the embodiments described above may be used solely or in combination with the other embodiments.

It is to be noted that the present disclosure can be configured as follows.

(1)

A stacked light receiving sensor including:

a first substrate that forms a first layer;

a second substrate that is joined with the first substrate and that forms a second layer;

a third substrate that is joined with the second substrate and that forms a third layer;

a pixel array section that includes a plurality of unit pixels arranged two-dimensionally in a matrix;

an analog circuit that reads a pixel signal from the pixel array section;

a logic circuit that is connected to the analog circuit and that outputs the pixel signal;

a memory that stores therein a neural network computing model;

a processing section that executes processing based on the neural network computing model, on data based on the pixel signal; and an output section that outputs a processing result at least based on the neural network computing model to an outside, in which the pixel array section is disposed on the first layer, the analog circuit is disposed on any one or more of the first to third layers, and the logic circuit, the processing section, and the memory are disposed on any one or more of the second and third layers.

(2)

The stacked light receiving sensor according to (1), in which the logic circuit includes a vertical decoder that specifies a read row for the plurality of unit pixels, and the analog circuit includes a vertical drive circuit that drives unit pixels in the read row specified by the vertical decoder.

(3)

The stacked light receiving sensor according to (2), in which the vertical drive circuit and the vertical decoder are disposed on different layers.

(4)

The stacked light receiving sensor according to any one of (1) to (3), in which the analog circuit includes a comparator disposed on the second layer or the third layer, and a counter disposed on the second layer or the third layer.

(5)

The stacked light receiving sensor according to (4), in which the comparator and the counter are disposed on different layers.

(6)

The stacked light receiving sensor according to (4), in which the analog circuit further includes a digital to analog converter that is disposed on the second layer or the third layer.

(7)

The stacked light receiving sensor according to (6), in which the comparator and the digital to analog converter are disposed on the same layer.

(8)

The stacked light receiving sensor according to any one of (4) to (7), in which the logic circuit includes a signal processing section that is disposed on the same layer as the layer on which the counter is disposed.

(9)

The stacked light receiving sensor according to (8), in which the logic circuit further includes a timing adjustment circuit that is disposed on the same layer as the layer on which the signal processing section is disposed.

(10)

The stacked light receiving sensor according to (8), in which the processing section is disposed on the same layer as the layer on which the signal processing section is disposed.

(11)

The stacked light receiving sensor according to any one of (1) to (9), in which the memory and the processing section are disposed on the same layer.

(12)

The stacked light receiving sensor according to any one of (1) to (11), in which the analog circuit is connected to a first power supply, and the logic circuit is connected to a second power supply.

(13)

The stacked light receiving sensor according to (12), in which the first power supply differs from the second power supply.

(14)

The stacked light receiving sensor according to any one of (1) to (13), further including:

an electromagnetic shield that is disposed in at least part of a region between the processing section and the first substrate.

(15)

The stacked light receiving sensor according to any one of (1) to (14), further including:

a fourth substrate that forms the third layer by being joined with the second substrate separately from the third substrate, in which the processing section is disposed on the fourth substrate.

(16)

An electronic apparatus including:

a stacked light receiving sensor; and a processor that executes predetermined processing on image data output from the stacked light receiving sensor, in which the stacked light receiving sensor includes a first substrate that forms a first layer, a second substrate that is joined with the first substrate and that forms a second layer, a third substrate that is joined with the second substrate and that forms a third layer, a pixel array section that includes a plurality of unit pixels arranged two-dimensionally in a matrix, an analog circuit that reads a pixel signal from the pixel array section, a logic circuit that is connected to the analog circuit and that outputs the pixel signal, a memory that stores therein a neural network computing model, a processing section that executes processing based on the neural network computing model, on data based on the pixel signal, and an output section that outputs a processing result at least based on the neural network computing model to an outside, the pixel array section is disposed on the first layer, the analog circuit is disposed on any one or more of the first to third layers, and the logic circuit, the processing section, and the memory are disposed on any one or more of the second and third layers.

REFERENCE SIGNS LIST

1: Imaging apparatus
10: Image sensor
11: Imaging section
12: Control section
13: Signal processing section
14: DSP
15: Memory
16: Selector
17: ADC
20: Application processor
30: Cloud server
40: Network
100, 300: First substrate
101: Pixel array section
101a: Unit pixel
102, 105, 302, 305, 322, 325, 327, 342, 345, 347: TSV array
103, 123, 126, 143, 146, 303: Pad array
104: Optical system
120, 320: Second substrate
122, 125: Interconnection
140, 340: Third substrate
141: Electromagnetic shield
147, 148: Substrate
201, 211, 221: Analog circuit
202: Logic circuit
211: Vertical drive circuit
212: Reference voltage supply section (DAC)
213: Comparator
214: Counter
220: Row drive section
221: Timing control circuit
222: Vertical decoder
223: Horizontal scanning circuit
224: Image signal processing section
225, 226, 227, 228: I/F
324, 344: TSV
326: OTP
401, 402: Circuit element
403-1, 403-2, 403-3, 403-12: Power supply pin
404-1, 404-2, 404-3, 404-12: Power supply pad
411, 421, 424, 441, 443, 451, 453, 461, 471: Interconnection
412, 413, 422, 442, 452, 462: TSV
501, 505, 506: Interconnection layer
502-1, 502-2, 502-2a, 502-3, 502-3a: Trench
503, 507: Interlayer insulating film

The invention claimed is:

1. A stacked light receiving sensor comprising:
a first substrate that forms a first layer;
a second substrate that is joined with the first substrate and that forms a second layer;
a third substrate that is joined with the second substrate and that forms a third layer;
a pixel array section that includes a plurality of unit pixels arranged two-dimensionally in a matrix;
an analog circuit that reads a pixel signal from the pixel array section;
a logic circuit that is connected to the analog circuit and that outputs the pixel signal;
a memory that stores therein a neural network computing model;
a processing section that executes processing based on the neural network computing model, on data based on the pixel signal; and
an output section that outputs a processing result at least based on the neural network computing model to an outside, wherein
the pixel array section is disposed on the first layer,
the analog circuit is disposed on any one or more of the first to third layers, and
the logic circuit, the processing section, and the memory are disposed on any one or more of the second and third layers,
wherein a first area defined by a first perimeter of the first substrate, a second area defined by a second perimeter of the second substrate, and a third area defined by a third perimeter of the third substrate substantially overlap each other from a plan view.

2. The stacked light receiving sensor according to claim 1, wherein
the logic circuit includes a vertical decoder that specifies a read row for the plurality of unit pixels, and
the analog circuit includes a vertical drive circuit that drives unit pixels in the read row specified by the vertical decoder.

3. The stacked light receiving sensor according to claim 2, wherein
the vertical drive circuit and the vertical decoder are disposed on different layers.

4. The stacked light receiving sensor according to claim 1, wherein
the analog circuit includes
a comparator disposed on the second layer or the third layer, and
a counter disposed on the second layer or the third layer.

5. The stacked light receiving sensor according to claim 4, wherein
the comparator and the counter are disposed on different layers.

6. The stacked light receiving sensor according to claim 4, wherein
the analog circuit further includes a digital to analog converter that is disposed on the second layer or the third layer.

7. The stacked light receiving sensor according to claim 6, wherein
the comparator and the digital to analog converter are disposed on a same layer.

8. The stacked light receiving sensor according to claim 4, wherein
the logic circuit includes a signal processing section that is disposed on a same layer as the layer on which the counter is disposed.

9. The stacked light receiving sensor according to claim 8, wherein the logic circuit further includes a timing adjustment circuit that is disposed on a same layer as the layer on which the signal processing section is disposed.

10. The stacked light receiving sensor according to claim 8, wherein
the processing section is disposed on a same layer as the layer on which the signal processing section is disposed.

11. The stacked light receiving sensor according to claim 1, wherein
the memory and the processing section are disposed on a same layer.

12. The stacked light receiving sensor according to claim 1, wherein
the analog circuit is connected to a first power supply, and the logic circuit is connected to a second power supply.

13. The stacked light receiving sensor according to claim 12, wherein
the first power supply differs from the second power supply.

14. The stacked light receiving sensor according to claim 1, further comprising:
a fourth substrate that forms the third layer by being joined with the second substrate separately from the third substrate, wherein
the processing section is disposed on the fourth substrate.

15. The stacked light receiving sensor according to claim 1, wherein
the analog circuit is disposed on the first layer.

16. A stacked light receiving sensor comprising:
a first substrate that forms a first layer;
a second substrate that is joined with the first substrate and that forms a second layer;
a third substrate that is joined with the second substrate and that forms a third layer;
a pixel array section that includes a plurality of unit pixels arranged two-dimensionally in a matrix;
an analog circuit that reads a pixel signal from the pixel array section;
a logic circuit that is connected to the analog circuit and that outputs the pixel signal;
a memory that stores therein a neural network computing model;
a processing section that executes processing based on the neural network computing model, on data based on the pixel signal;
an output section that outputs a processing result at least based on the neural network computing model to an outside; and
an electromagnetic shield that is disposed in at least part of a region between the processing section and the analog circuit, wherein
the pixel array section is disposed on the first layer,
the analog circuit is disposed on any one or more of the first to third layers,
the logic circuit, the processing section, and the memory are disposed on any one or more of the second and third layers, and
wherein a first area defined by a first perimeter of the first substrate, a second area defined by a second perimeter of the second substrate, and a third area defined by a third perimeter of the third substrate substantially overlap each other from a plan view.

17. The stacked light receiving sensor according to claim 16, wherein the electromagnetic shield shields the first substrate from a first combination of the memory and the processing section, a second combination of the memory, the processing section, and the logic circuit, a third combination of the memory, the processing section, and the analog circuit, or a fourth combination of the memory, the processing section, the analog circuit, and the logic circuit.

18. An electronic apparatus comprising:
a stacked light receiving sensor; and
a processor that executes predetermined processing on image data output from the stacked light receiving sensor, wherein
the stacked light receiving sensor includes
a first substrate that forms a first layer,
a second substrate that is joined with the first substrate and that forms a second layer,
a third substrate that is joined with the second substrate and that forms a third layer,
a pixel array section that includes a plurality of unit pixels arranged two-dimensionally in a matrix,
an analog circuit that reads a pixel signal from the pixel array section,
a logic circuit that is connected to the analog circuit and that outputs the pixel signal,
a memory that stores therein a neural network computing model,
a processing section that executes processing based on the neural network computing model, on data based on the pixel signal, and
an output section that outputs a processing result at least based on the neural network computing model to an outside,
the pixel array section is disposed on the first layer,
the analog circuit is disposed on any one or more of the first to third layers, and
the logic circuit, the processing section, and the memory are disposed on any one or more of the second and third layers,
wherein a first area defined by a first perimeter of the first substrate, a second area defined by a second perimeter of the second substrate, and a third area defined by a third perimeter of the third substrate substantially overlap each other from a plan view.

19. The electronic apparatus according to claim 18, wherein
the logic circuit includes a vertical decoder that specifies a read row for the plurality of unit pixels, and
the analog circuit includes a vertical drive circuit that drives unit pixels in the read row specified by the vertical decoder.

20. The electronic apparatus according to claim 18, wherein
the analog circuit is connected to a first power supply, and the logic circuit is connected to a second power supply.

* * * * *